(12) United States Patent
Yamazaki et al.

(10) Patent No.: US 9,704,704 B2
(45) Date of Patent: Jul. 11, 2017

(54) SEMICONDUCTOR DEVICE AND DISPLAY DEVICE INCLUDING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Junichi Koezuka, Tochigi (JP); Kenichi Okazaki, Tochigi (JP); Masami Jintyou, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/921,141

(22) Filed: Oct. 23, 2015

(65) Prior Publication Data

US 2016/0118502 A1 Apr. 28, 2016

(30) Foreign Application Priority Data

Oct. 28, 2014 (JP) .................................. 2014-218938

(51) Int. Cl.
*H01L 21/36* (2006.01)
*H01L 21/425* (2006.01)
(Continued)

(52) U.S. Cl.
CPC .... *H01L 21/02323* (2013.01); *H01L 21/0234* (2013.01); *H01L 21/0262* (2013.01);
(Continued)

(58) Field of Classification Search
CPC ............. H01L 29/7869; H01L 27/1225; H01L 21/02323
See application file for complete search history.

(56) References Cited

U.S. PATENT DOCUMENTS 4,904,526 A * 2/1990 Koskenmaki ............ H01B 1/08
136/256
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Victor A Mandala
*Assistant Examiner* — Regan J Rundio
(74) *Attorney, Agent, or Firm* — Fish & Richardson, P.C.

(57) ABSTRACT

A change in electrical characteristics in a semiconductor device including an oxide semiconductor film is inhibited, and the reliability is improved. The semiconductor device includes a gate electrode, a first insulating film over the gate electrode, an oxide semiconductor film over the first insulating film, a source electrode electrically connected to the oxide semiconductor film, a drain electrode electrically connected to the oxide semiconductor film, a second insulating film over the oxide semiconductor film, the source electrode, and the drain electrode, a first metal oxide film over the second insulating film, and a second metal oxide film over the first metal oxide film. The first metal oxide film contains at least one metal element that is the same as a metal element contained in the oxide semiconductor film. The second metal oxide film includes a region where the
(Continued)

second metal oxide film and the first metal oxide film are mixed.

15 Claims, 35 Drawing Sheets

(51) Int. Cl.
- *H01L 29/786* (2006.01)
- *H01L 21/02* (2006.01)
- *H01L 29/66* (2006.01)
- *H01L 29/417* (2006.01)
- *H01L 29/423* (2006.01)
- *H01L 29/36* (2006.01)
- *H01L 21/473* (2006.01)
- *H01L 21/768* (2006.01)

(52) U.S. Cl.
CPC .. *H01L 21/02337* (2013.01); *H01L 21/02554* (2013.01); *H01L 21/02565* (2013.01); *H01L 21/02631* (2013.01); *H01L 21/425* (2013.01); *H01L 29/41733* (2013.01); *H01L 29/42384* (2013.01); *H01L 29/66742* (2013.01); *H01L 29/7869* (2013.01); *H01L 29/78696* (2013.01); *H01L 21/473* (2013.01); *H01L 21/76826* (2013.01); *H01L 21/76832* (2013.01)

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,767,505 B2 | 8/2010 | Son et al. | |
| 8,148,721 B2 | 4/2012 | Hayashi et al. | |
| 8,551,824 B2 | 10/2013 | Yamazaki et al. | |
| 8,723,176 B2 | 5/2014 | Yamazaki | |
| 8,748,240 B2 | 6/2014 | Yamazaki | |
| 8,785,258 B2 | 7/2014 | Yamazaki | |
| 8,828,794 B2 | 9/2014 | Yamazaki et al. | |
| 8,828,811 B2 | 9/2014 | Yamazaki | |
| 8,865,534 B2 | 10/2014 | Yamazaki | |
| 8,945,982 B2 | 2/2015 | Yamazaki | |
| 9,130,049 B2 | 9/2015 | Sano et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0284844 A1 | 11/2011 | Endo et al. | |
| 2013/0137232 A1 | 5/2013 | Ito et al. | |
| 2013/0187150 A1 | 7/2013 | Yamazaki et al. | |
| 2013/0200367 A1* | 8/2013 | Yamazaki | H01L 29/41733 257/43 |
| 2013/0207111 A1* | 8/2013 | Yamazaki | H01L 29/78681 257/57 |
| 2014/0001467 A1 | 1/2014 | Yamazaki et al. | |
| 2014/0038351 A1 | 2/2014 | Yamazaki et al. | |
| 2014/0103337 A1 | 4/2014 | Yamazaki et al. | |
| 2014/0103338 A1 | 4/2014 | Yamazaki et al. | |
| 2014/0103340 A1 | 4/2014 | Yamazaki et al. | |
| 2014/0106504 A1 | 4/2014 | Yamazaki et al. | |
| 2014/0113405 A1 | 4/2014 | Tsubuku et al. | |

(56) References Cited

U.S. PATENT DOCUMENTS

| | | | |
|---|---|---|---|
| 2014/0151686 A1 | 6/2014 | Yamazaki et al. | |
| 2014/0154837 A1 | 6/2014 | Yamazaki | |
| 2014/0175435 A1 | 6/2014 | Yamazaki et al. | |
| 2014/0225103 A1 | 8/2014 | Tezuka et al. | |
| 2015/0076496 A1 | 3/2015 | Tanaka et al. | |
| 2015/0249157 A1* | 9/2015 | Yamazaki | H01L 29/7869 257/43 |
| 2015/0249160 A1* | 9/2015 | Yamazaki | H01L 29/26 257/43 |
| 2015/0303309 A1 | 10/2015 | Koezuka et al. | |
| 2015/0372022 A1 | 12/2015 | Okazaki et al. | |
| 2015/0372023 A1* | 12/2015 | Jintyou | H01L 27/1225 257/43 |
| 2016/0079089 A1 | 3/2016 | Koezuka et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165529 A | 6/2006 |
| JP | 2011-199272 A | 10/2011 |
| JP | 2012-009836 A | 1/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMo_3(ZnO)_m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a $Zn_4s$ conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

150

150

150

100A

100A

100B

100B

FIG. 20A
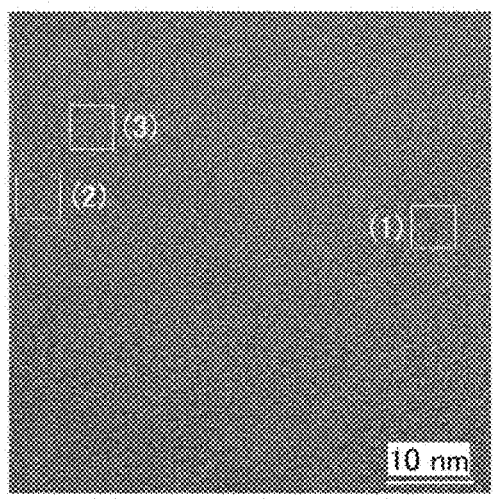
FIG. 20B  FIG. 20C  FIG. 20D
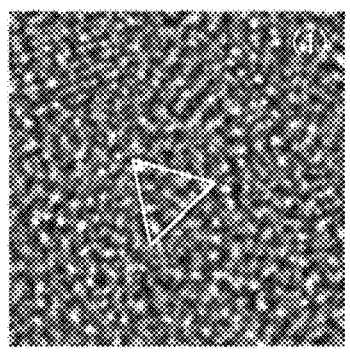 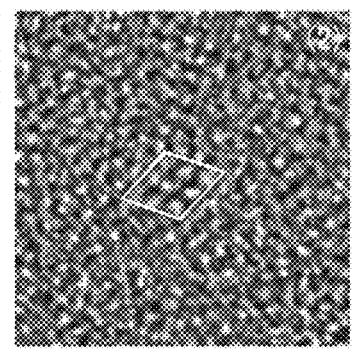 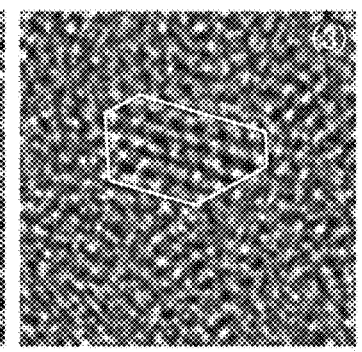

SEMICONDUCTOR DEVICE AND DISPLAY DEVICE INCLUDING THE SAME

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are used in a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention (e.g., Patent Document 1).

A method for manufacturing a semiconductor device in which an oxide semiconductor layer is highly purified in the following manner is disclosed: an oxide insulating layer is formed over the oxide semiconductor layer; oxygen is introduced (added) through the oxide insulating layer; heat treatment is performed; and impurities such as hydrogen, moisture, a hydroxyl group, or hydride are removed from the oxide semiconductor layer by the introduction of oxygen and the heat treatment (e.g., Patent Document 2).

REFERENCE

Patent Document

[Patent Document 1] Japanese Published Patent Application No. 2006-165529
[Patent Document 2] Japanese Published Patent Application No. 2011-199272

SUMMARY OF THE INVENTION

In the case where a transistor including an oxide semiconductor film in a channel region is manufactured, impurities such as hydrogen or moisture entering the oxide semiconductor film of the channel region adversely affect the transistor characteristics and therefore cause a problem. Moreover, oxygen vacancies formed in the oxide semiconductor film of the channel region adversely affect the transistor characteristics and therefore cause a problem. For example, oxygen vacancies formed in the oxide semiconductor film of the channel region are bonded to hydrogen to serve as a carrier supply source. The carrier supply source generated in the oxide semiconductor film of the channel region causes a change in the electrical characteristics, typically, a shift in the threshold voltage, of the transistor including the oxide semiconductor film. Further, there is a problem in that electrical characteristics fluctuate among the transistors. Therefore, it is preferable that the amount of oxygen vacancies in the channel region of the oxide semiconductor film be as small as possible. Moreover, it is preferable that the amount of impurities such as hydrogen or moisture as well as oxygen vacancies in the channel region of the oxide semiconductor film be as small as possible.

In view of the above problems, an object of one embodiment of the present invention is to inhibit a change in electrical characteristics and to improve reliability in a semiconductor device using a transistor including an oxide semiconductor. Another object of one embodiment of the present invention is to provide a semiconductor device with low power consumption. Another object of one embodiment of the present invention is to provide a novel semiconductor device. Another object of one embodiment of the present invention is to provide a novel display device.

Note that the description of the above objects does not preclude the existence of other objects. In one embodiment of the present invention, there is no need to achieve all the objects. Objects other than the above objects will be apparent from and can be derived from the description of the specification and the like.

One embodiment of the present invention is a semiconductor device including: a gate electrode; a first insulating film over the gate electrode; an oxide semiconductor film over the first insulating film; a source electrode electrically connected to the oxide semiconductor film; a drain electrode electrically connected to the oxide semiconductor film; a second insulating film over the oxide semiconductor film, the source electrode, and the drain electrode; a first metal oxide film over the second insulating film; and a second metal oxide film over the first metal oxide film. The first metal oxide film contains at least one metal element that is the same as a metal element contained in the oxide semiconductor film. The second metal oxide film includes a region where the second metal oxide film and the first metal oxide film are mixed.

Another embodiment of the present invention is a semiconductor device including: a first gate electrode; a first insulating film over the first gate electrode; an oxide semiconductor film over the first insulating film; a source electrode electrically connected to the oxide semiconductor film; a drain electrode electrically connected to the oxide semiconductor film; a second insulating film over the oxide semiconductor film, the source electrode, and the drain electrode; a first metal oxide film over the second insulating film; a second metal oxide film over the first metal oxide film; and a second gate electrode over the second metal oxide film. The first metal oxide film contains at least one metal element that is the same as a metal element contained in the oxide semiconductor film. The second metal oxide film includes a region where the second metal oxide film and the first metal oxide film are mixed.

Another embodiment of the present invention is a semiconductor device including: a gate electrode; a first insulating film over the gate electrode; an oxide semiconductor film over the first insulating film; a second insulating film over the oxide semiconductor film; a first metal oxide film over the second insulating film; a second metal oxide film over the first metal oxide film; a source electrode over the second metal oxide film, which is electrically connected to the oxide semiconductor film; and a drain electrode over the second metal oxide film, which is electrically connected to the oxide semiconductor film. The first metal oxide film contains at least one metal element that is the same as a metal element contained in the oxide semiconductor film. The second metal oxide film includes a region where the second metal oxide film and the first metal oxide film are mixed.

In the above embodiments, it is preferable that the oxide semiconductor film contain In, Zn, and M (M is Ti, Ga, Y, Zr, La, Ce, Nd, Sn, or Hf). In the above embodiments, it is preferable that the oxide semiconductor film include a crystal part and that the crystal part have c-axis alignment.

In the above embodiments, it is preferable that oxygen molecules of more than or equal to $8.0 \times 10^{14}/cm^2$ are detected from the second insulating film by thermal desorption spectroscopy.

In the above embodiments, it is preferable that the first metal oxide film contain In. In the above embodiments, it is preferable that the second metal oxide film contain Al.

Another embodiment of the present invention is a display device including the semiconductor device according to any one of the above embodiments and a display element. Another embodiment of the present invention is a display module including the display device and a touch sensor. Another embodiment of the present invention is an electronic device including the semiconductor device according to any one of the above embodiments, the display device, or the display module; and an operation key or a battery.

According to one embodiment of the present invention, a change in electrical characteristics can be inhibited in a semiconductor device using a transistor including an oxide semiconductor, and the reliability of the semiconductor device can be improved. According to one embodiment of the present invention, a semiconductor device that consumes less power can be provided. According to one embodiment of the present invention, a novel semiconductor device can be provided. According to one embodiment of the present invention, a novel display device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 20A to 20D are Cs-corrected high-resolution TEM images of a plane of a CAAC-OS;

DETAILED DESCRIPTION OF THE INVENTION

Figure 1A:
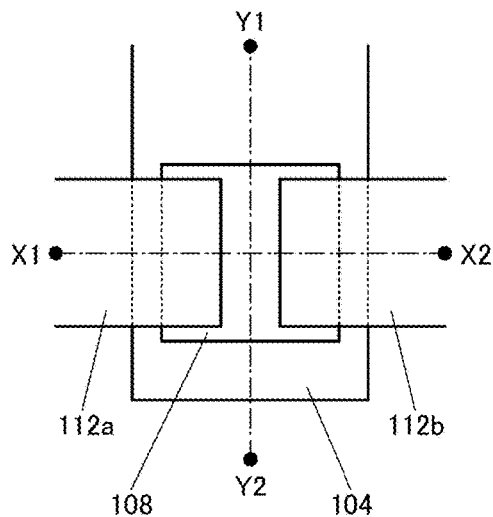
FIGS. 1A to 1C are a top view and cross-sectional views illustrating one embodiment of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to the shapes or values shown in the drawings.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a "silicon oxynitride film" refers to a film that contains oxygen at a higher proportion than nitrogen, and a "silicon nitride oxide film" refers to a film that contains nitrogen at a higher proportion than oxygen.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

Embodiment 1

In this embodiment, a semiconductor device of one embodiment of the present invention will be described with reference to FIGS. 1A to 1C, FIG. 2, FIGS. 3A to 3C, FIGS. 4A to 4C, FIGS. 5A to 5C, FIGS. 6A to 6D, FIGS. 7A and 7B, FIGS. 8A to 8C, FIGS. 9A to 9C, FIGS. 10A and 10B, FIGS. 11A to 11C, FIGS. 12A to 12C, FIGS. 13A and 13B, FIGS. 14A to 14D, FIGS. 15A to 15D, FIGS. 16A and 16B, FIGS. 17A and 17B, and FIGS. 18A to 18D.

Structural Example 1 of Semiconductor Device

Figure 1B:
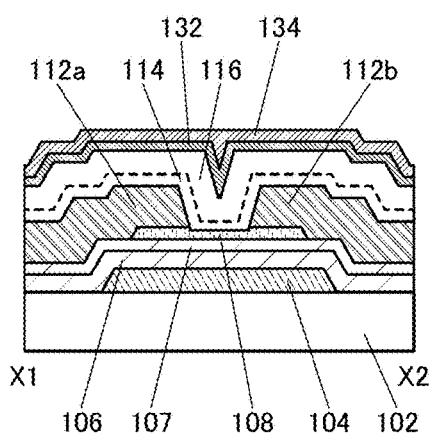
Figure 1C:
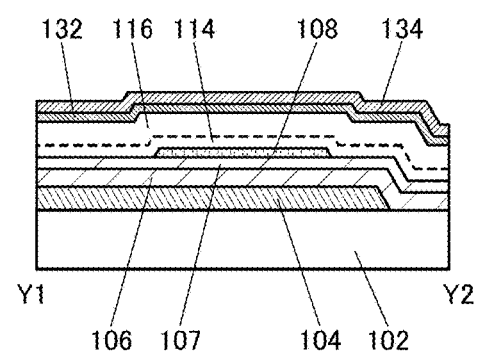

FIG. 1A is a top view of a transistor 100 that is a semiconductor device of one embodiment of the present invention. FIG. 1B is a cross-sectional view taken along the dashed dotted line X1-X2 in FIG. 1A, and FIG. 1C is a cross-sectional view taken along the dashed dotted line Y1-Y2 in FIG. 1A. Note that in FIG. 1A, some components of the transistor 100 (e.g., an insulating film serving as a gate insulating film) are not illustrated to avoid complexity. The direction of the dashed dotted line X1-X2 may be called a channel length direction of the transistor, and the direction of the dashed dotted line Y1-Y2 may be called a channel width direction of the transistor. As in FIG. 1A, some components might not be illustrated in some top views of transistors described below.

The transistor 100 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, a conductive film 112a functioning as a source electrode electrically connected to the oxide semiconductor film 108, and a conductive film 112b functioning as a drain electrode electrically connected to the oxide semiconductor film 108. The transistor 100 also includes insulating films 114 and 116 over the oxide semiconductor film 108 and the conductive films 112a and 112b, a metal oxide film 132 over the insulating film 116, and a metal oxide film 134 over the metal oxide film 132. The metal oxide film 132 contains at least one metal element that is the same as a metal element contained in the oxide semiconductor film 108. The metal oxide film 134 includes a region where the metal oxide film 134 is mixed with the metal oxide film 132.

In some cases, the insulating films 106 and 107 are collectively referred to as a first insulating film, and the first insulating film has a function of a gate insulating film of the transistor 100. In some cases, the insulating films 114 and 116 are collectively referred to as a second insulating film, and the second insulating film has a function of supplying oxygen to the oxide semiconductor film 108.

When impurities such as hydrogen or moisture enters the oxide semiconductor film 108 in the transistor 100, the impurities are bonded to oxygen vacancies formed in the oxide semiconductor film 108, producing electrons serving as carriers. The carriers due to the impurities tend to make the transistor 100 be normally on. Therefore, for stable transistor characteristics, it is important to reduce impurities such as hydrogen or moisture in the oxide semiconductor film 108 and to reduce oxygen vacancies in the oxide semiconductor film 108.

Then, in the structure of the transistor of one embodiment of the present invention, excess oxygen is introduced into an insulating film over the oxide semiconductor film 108, here, the insulating films 114 and 116 over the oxide semiconductor film 108, whereby oxygen is moved from the insulating films 114 and 116 to the oxide semiconductor film 108 to fill oxygen vacancies in the oxide semiconductor film 108.

However, in some cases, oxygen introduced into the insulating films 114 and 116 is diffused to the outside by heat treatment during the manufacturing process of the transistor 100, and cannot be favorably moved to the oxide semiconductor film 108. However, in the semiconductor device of one embodiment of the present invention, the metal oxide films 132 and 134 are provided in an upper portion of the transistor 100, specifically, over the insulating film 116. The provision of the metal oxide films 132 and 134 can inhibit outward diffusion of oxygen from the insulating films 114 and 116. In addition, the provision of the metal oxide films 132 and 134 can inhibit entry of impurities (e.g., hydrogen and water) from the outside.

Being provided with excess oxygen, the insulating films 114 and 116 each include a region containing oxygen in excess of that in the stoichiometric composition (oxygen excess region). In other words, the insulating films 114 and 116 are insulating films capable of releasing oxygen. The oxygen excess region is formed in the insulating films 114 and 116 in such a manner that oxygen is introduced into the insulating films 114 and 116 after the deposition, for example.

Oxygen can be introduced by a method in which acceleration energy is applied to an oxygen gas under reduced pressure, specifically, an ion implantation method, an ion doping method, a plasma immersion ion implantation method, plasma treatment, or the like. When oxygen is introduced, a substrate is preferably heated because a larger amount of oxygen can be introduced. The substrate temperature at the time when oxygen is introduced is preferably higher than room temperature and lower than 350° C., for example. For the above plasma treatment, an apparatus with which an oxygen gas is made to be plasma by high-frequency power (also referred to as a plasma etching apparatus or a plasma ashing apparatus) is preferably used.

The amount of released oxygen can be found by measuring an insulating film by thermal desorption spectroscopy (TDS). For example, the amount of released oxygen molecules from the insulating films 114 and 116 is more than or equal to $8.0 \times 10^{14}/cm^2$, preferably more than or equal to $1.0 \times 10^{15}/cm^2$, and further preferably more than or equal to $1.5 \times 10^{15}/cm^2$ by TDS. Note that the surface temperature of the films in TDS is higher than or equal to 100° C. and lower than or equal to 700° C., preferably higher than or equal to 100° C. and lower than or equal to 500° C.

In one embodiment of the present invention, in order to form an oxygen-excess region in the insulating films 114 and 116, the metal oxide film 132 is formed over the insulating film 116 and oxygen is introduced into the insulating films 114 and 116 through the metal oxide film 132. Therefore, the metal oxide film 132 preferably has a function of allowing oxygen to pass through. Introducing oxygen through the metal oxide film 132 into the insulating films 114 and 116 enables favorable introduction of oxygen into the insulating films 114 and 116. Furthermore, the metal oxide film 132 has a function of inhibiting oxygen from being released outside except during the introduction of oxygen. The metal oxide film 132 may contain at least a metal element that is also contained in the oxide semiconductor film 108, for example.

When the metal oxide film 132 is formed using a material containing indium, oxygen can be favorably introduced into the insulating films 114 and 116. Examples of a material containing indium that can be used for the metal oxide film 132 include indium oxide containing tungsten oxide, indium zinc oxide containing tungsten oxide, indium oxide containing titanium oxide, indium tin oxide containing titanium oxide, indium tin oxide (ITO), indium zinc oxide, and indium tin oxide containing silicon (ITSO). Note that the above indium-containing materials are conductive materials with light-transmitting properties. Among the above materials, it is particularly preferable to use ITSO for the metal oxide film 132 because ITSO can be deposited over an insulating film having roughness or the like with favorable coverage.

In one embodiment of the present invention, the metal oxide film 134 is provided over the metal oxide film 132. The provision of the metal oxide film 134 can further inhibit oxygen in the insulating films 114 and 116 from diffusing to the outside.

When the metal oxide film 134 is formed using a material containing aluminum, outward diffusion of oxygen from the insulating films 114 and 116 and/or entry of impurities (e.g., hydrogen and water) from the outside can be suppressed. Examples of a material containing aluminum that can be used for the metal oxide film 134 include aluminum oxide.

There is a region in which the metal oxide film 132 and the metal oxide film 134 are mixed. Here, the region in which the metal oxide film 132 and the metal oxide film 134 are mixed will be described with reference to FIG. 2.

Figure 2:
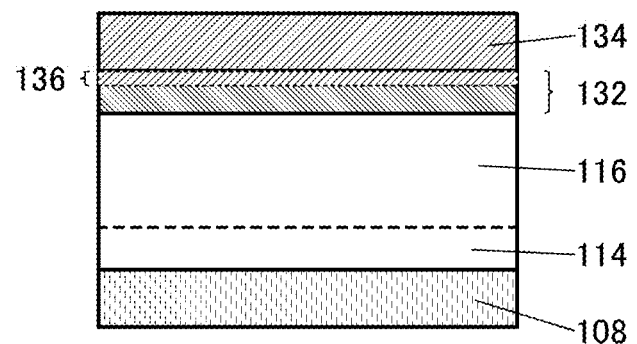
FIG. 2 is a cross-sectional view illustrating one embodiment of a semiconductor device.

FIG. 2 is a cross-sectional view of a stacked structure including the oxide semiconductor film 108, the insulating films 114 and 116, and the metal oxide films 132 and 134.

A mixed region 136 is formed near an interface between the metal oxide film 132 and the metal oxide film 134. The thickness of the mixed region 136 is greater than or equal to 1 nm and less than or equal to 10 nm, preferably greater than or equal to 1 nm and less than or equal to 3 nm. In the case where the metal oxide film 132 is formed of a conductive material and the metal oxide film 134 is formed of an insulating material, for example, the formation of the mixed region 136 can reduce the conductivity of the metal oxide film 132. Furthermore, the formation of the mixed region 136 in the entire region of the metal oxide film 132 can make the metal oxide film 132 electrically insulated.

The mixed region 136 can be formed, for example, when the metal oxide film 134 is formed by a sputtering method and the sputtered atoms get into the metal oxide film 132. Alternatively, the mixed region 136 can be formed by thermodiffusion near the interface between the metal oxide film 132 and the metal oxide film 134, when the metal oxide film 134 is formed over the metal oxide film 132 and then the metal oxide films are subjected to heat treatment (at a temperature of 100° C. or higher and 350° C. or lower, for example).

The provision of the insulating films 114 and 116 over the oxide semiconductor film 108 in the above manner makes it possible to move oxygen in the insulating films 114 and 116 to the oxide semiconductor film 108, whereby oxygen vacancies formed in the oxide semiconductor film 108 can be filled. Furthermore, the provision of the metal oxide films 132 and 134 over the insulating film 116 can inhibit oxygen in the insulating films 114 and 116 from diffusing to the outside. The provision of the metal films 132 and 134 over the insulating film 116 can also inhibit entry of impurities from the outside. Thus, a novel semiconductor device with high reliability, in which oxygen vacancies in the oxide semiconductor film 108 are filled and entry of impurities is inhibited, can be provided.

Constituent elements of the semiconductor device of this embodiment will be described below in detail.
<Substrate>

There is no particular limitation on the property of a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.
<Conductive Film>

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy containing any of these metal element as its component; an alloy including a combination of any of these metal elements; or the like.

Furthermore, each of the conductive films 104, 112a, and 112b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 104, 112a, and 112b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. The use of a Cu—X alloy film enables the manufacturing cost to be reduced because wet etching process can be used in the processing.
<Gate Insulating Film>

As each of the insulating films 106 and 107 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked structure of the insulating films 106 and 107, an insulating film of a single layer formed using a material selected from the above or an insulating film including three or more stacked layers may be used.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film which is capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to obtain a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106, and a silicon oxide film is formed as the insulating film 107. A silicon nitride film has a higher dielectric constant than a silicon oxide film and needs a larger thickness for capacitance equivalent to that of a silicon oxide film. Thus, when a silicon nitride film is included in the gate insulating film of the transistor 100, the physical thickness of the insulating film can be increased. This makes it possible to suppress a decrease in withstand voltage of the transistor 100 and furthermore to increase the withstand voltage, thereby inhibiting electrostatic breakdown of the transistor 100.

<Oxide Semiconductor Film>

The oxide semiconductor film 108 contains In, Zn, and M (M is Ti, Ga, Y, Zr, La, Ce, Nd, Sn, or Hf). Typically, In—Ga oxide, In—Zn oxide, or In-M-Zn oxide can be used for the oxide semiconductor film 108. It is particularly preferable to use In-M-Zn oxide for the semiconductor film 108.

In the case where the oxide semiconductor film 108 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable. Note that the atomic ratio of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

Note that in the case where the oxide semiconductor film 108 is formed of In-M-Zn oxide, the proportion of In and the proportion of M, not taking Zn and O into consideration, are preferably greater than 25 atomic % and less than 75 atomic %, respectively, and more preferably greater than 34 atomic % and less than 66 atomic %, respectively.

The energy gap of the oxide semiconductor film 108 is 2 eV or more, preferably 2.5 eV or more, further preferably 3 eV or more. With the use of an oxide semiconductor having such a wide energy gap, the off-state current of the transistor 100 can be reduced.

The thickness of the oxide semiconductor film 108 is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor film with low carrier density is used as the oxide semiconductor film 108. For example, the carrier density of the oxide semiconductor film 108 is greater than or equal to $1\times10^{-9}$/cm$^3$ and less than $8\times10^{11}$/cm$^3$, preferably greater than or equal to $1\times10^{-9}$/cm$^3$ and less than $1\times10^{11}$/cm$^3$, further preferably greater than or equal to $1\times10^{-9}$/cm$^3$ and less than $1\times10^{10}$/cm$^3$.

Note that, without limitation to the compositions and materials described above, a material with an appropriate composition may be used in accordance with required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

Note that it is preferable to use, as the oxide semiconductor film 108, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, a highly purified intrinsic or substantially highly purified intrinsic oxide semiconductor film has an extremely low off-state current; even when an element has a channel width of $1\times10^6$ µm and a channel length (L) of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen contained in the oxide semiconductor film 108 reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. For this reason, it is preferable that hydrogen be reduced as much as possible in the oxide semiconductor film 108. Specifically, the hydrogen concentration in the oxide semiconductor film 108, which is measured by secondary ion mass spectrometry (SIMS), is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$, yet further preferably lower than or equal to $1\times10^{18}$ atoms/cm$^3$, even further preferably lower than or equal to $5\times10^{17}$ atoms/cm$^3$, or further preferably lower than or equal to $1\times10^{16}$ atoms/cm$^3$.

When silicon or carbon that is one of elements belonging to Group 14 is contained in the oxide semiconductor film 108, oxygen vacancies are increased in the oxide semiconductor film 108, and the oxide semiconductor film 108 becomes an n-type film. Thus, the concentration of silicon or carbon (the concentration is measured by SIMS) in the oxide semiconductor film 108 or the concentration of silicon or carbon (the concentration is measured by SIMS) in the vicinity of an interface with the oxide semiconductor film 108 is set to be lower than or equal to $2 \times 10^{18}$ atoms/cm$^3$, preferably lower than or equal to $2 \times 10^{17}$ atoms/cm$^3$.

In addition, the concentration of alkali metal or alkaline earth metal of the oxide semiconductor film 108, which is measured by SIMS, is set to be lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108.

Further, when containing nitrogen, the oxide semiconductor film 108 easily becomes n-type by generation of electrons serving as carriers and an increase of carrier density. Thus, a transistor including an oxide semiconductor film that contains nitrogen is likely to have normally-on characteristics. For this reason, nitrogen in the oxide semiconductor film is preferably reduced as much as possible; the concentration of nitrogen which is measured by SIMS is preferably set, for example, lower than or equal to $5 \times 10^{18}$ atoms/cm$^3$.

The oxide semiconductor film 108 may have a non-single-crystal structure, for example. The non-single-crystal structure includes, for example, a CAAC-OS described later, a polycrystalline structure, an nc-OS, an a-like OS, and an amorphous structure. Among the non-single-crystal structure, the amorphous structure has the highest density of defect states, whereas CAAC-OS has the lowest density of defect states.

The oxide semiconductor film 108 may have an amorphous structure, for example. The oxide semiconductor films having the amorphous structure each have disordered atomic arrangement and no crystalline component, for example. Alternatively, the oxide films having an amorphous structure have, for example, an absolutely amorphous structure and no crystal part.

Note that the oxide semiconductor film 108 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure including two or more of a region having an amorphous structure, a region having a microcrystalline structure, a region having a polycrystalline structure, a CAAC-OS region, and a region having a single-crystal structure.

<Protective Insulating Film>

The insulating films 114 and 116 have a function of a protective insulating film. The insulating films 114 and 116 contain oxygen. Furthermore, the insulating film 114 is an insulating film that allows oxygen to pass through. Note that the insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that passes through the insulating film 114 is decreased.

Note that not all oxygen entering the insulating film 114 from the outside move to the outside of the insulating film 114 and some oxygen remains in the insulating film 114. Furthermore, movement of oxygen occurs in the insulating film 114 in some cases in such a manner that oxygen enters the insulating film 114 and oxygen contained in the insulating film 114 moves to the outside of the insulating film 114. When an oxide insulating film that allows oxygen to pass through is formed as the insulating film 114, oxygen released from the insulating film 116 provided over the insulating film 114 can be moved to the oxide semiconductor film 108 through the insulating film 114.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of the film becomes a temperature higher than or equal to 50° C. and lower than or equal to 650° C., or preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the vicinity of the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide contained in the insulating film 114 reacts with ammonia contained in the insulating film 116 in heat treatment, nitrogen oxide contained in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller amount of nitrogen oxide the oxide insulating film contains.

The concentration of nitrogen of the above oxide insulating film measured by SIMS is lower than or equal to $6 \times 10^{20}$ atoms/cm$^3$.

The above oxide insulating film is formed by a PECVD method at a substrate temperature higher than or equal to 220° C., higher than or equal to 280° C., or higher than or equal to 350° C. using silane and dinitrogen monoxide, whereby a dense and hard film can be formed.

The insulating film 116 is formed using an oxide insulating film that contains oxygen at a higher proportion than oxygen in the stoichiometric composition. Part of oxygen is released by heating from the oxide insulating film containing more oxygen than that in the stoichiometric composition. The oxide insulating film containing oxygen in excess of that in the stoichiometric composition is an oxide insulating film of which the amount of released oxygen converted into oxygen atoms is greater than or equal to $8.0 \times 10^{14}$ atoms/cm$^2$, preferably greater than or equal to $1.0 \times 10^{15}$ atoms/cm$^2$ in TDS. Note that the temperature of the film surface in the TDS is higher than or equal to 100° C. and lower than or equal to 700° C., preferably higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the amount of defects in the insulating film 116 be small, and typically the spin density corresponding to a signal which appears at g=2.001 due to a dangling bond of silicon, be lower than $1.5 \times 10^{18}$ spins/cm$^3$, more preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher defect density than the insulating film 114.

Further, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this structure. For example, a single-layer structure of either one of the insulating films 114 and 116 may be employed.

<Metal Oxide Film>

The metal oxide film 132 has a function of allowing oxygen to pass through. The provision of the metal oxide film 132 makes it possible to introduce oxygen favorably into the insulating films 114 and 116. Furthermore, the metal oxide film 132 has a function of inhibiting release of oxygen except during the introduction of oxygen.

The metal oxide film 132 contains at least one metal element that is the same as one of those contained in the oxide semiconductor film 108. In the case where the oxide semiconductor film 108 contains In, Zn, and M (M is Ti, Ga, Y, Zr, La, Ce, Nd, Sn, or Hf), for example, the metal oxide film 132 contains In, Zn, or M. It is particularly preferable that the metal oxide film 132 be a conductive film containing In or a semiconductor film containing In.

The metal oxide film 134 has a function of inhibiting release of oxygen and a function of blocking impurities such as oxygen, hydrogen, water, alkali metal, and alkaline earth metal. The provision of the metal oxide film 134 makes it possible to inhibit outward diffusion of oxygen from the oxide semiconductor film 108, outward diffusion of oxygen contained in the insulating films 114 and 116, and entry of hydrogen, water, or the like into the oxide semiconductor film 108 from the outside.

It is preferable that the metal oxide film 134 contain aluminum (Al), gallium (Ga), yttrium (Y), or hafnium (Hf). Examples of a material that can be used for the metal oxide film 134 include aluminum oxide, aluminum oxynitride, aluminum nitride oxide, gallium oxide, gallium oxynitride, gallium nitride oxide, yttrium oxide, yttrium oxynitride, yttrium nitride oxide, hafnium oxide, hafnium oxynitride, and hafnium nitride oxide. It is particularly preferable to use aluminum oxide for the metal oxide film 134, in which case outward diffusion of oxygen from the oxide semiconductor film 108 and the insulating films 114 and 116 and entry of hydrogen, water, or the like into the oxide semiconductor film 108 from the outside can be inhibited.

It is preferable to form the metal oxide film 134 by a sputtering method or an atomic layer deposition (ALD) method.

Note that the above-described various films such as the conductive film, the insulating film, the oxide semiconductor film, and the metal oxide film can be formed by a sputtering method, a chemical vapor deposition (CVD) method, a vacuum evaporation method, a pulsed laser deposition (PLD) method, or the like. Alternatively, the above-described various films such as the conductive film, the insulating film, and the oxide semiconductor film can be formed by a plasma enhanced chemical vapor deposition (PECVD) method, a thermal CVD method, or an ALD method. As an example of a thermal CVD method, a metal organic chemical vapor deposition (MOCVD) method can be given. Further alternatively, the above-described various films such as the conductive film, the insulating film, the oxide semiconductor film, and the metal oxide film can be formed by a coating method or a printing method.

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time while the pressure in the chamber is set to an atmospheric pressure or a reduced pressure, and the source gas and the oxidizer react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust the film thickness and thus is suitable for manufacturing a minute FET.

The above-described variety of films such as the conductive film, the insulating film, the oxide semiconductor film, and the metal oxide film in this embodiment can be formed by an ALD method or a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed with a deposition apparatus employing ALD, two kinds of gases, i.e., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on the surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed with a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed with a deposition apparatus employing ALD, an $In(CH_3)_3$ gas and an $O_3$ gas are used to form an InO layer, then a $Ga(CH_3)_3$ gas and an $O_3$ gas are used to form a GaO layer, and then a $Zn(CH_3)_2$ gas and an $O_3$ gas are used to form a ZnO layer. Note that the order of these layers is not limited to this example. A mixed compound layer such as an InGaO layer, an InZnO layer, or a GaZnO layer may be formed by mixing these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Furthermore, a $Zn(CH_3)_2$ gas may be used.

Structural Example 2 of Semiconductor Device

A structural example which is different from the transistor 100 in FIGS. 1A to 1C will be described with reference to FIGS. 3A to 3C. Note that in the case where a portion has a function similar to that described above, the same hatch pattern is applied to the portion, and the portion is not especially denoted by a reference numeral in some cases.

Figure 3A:
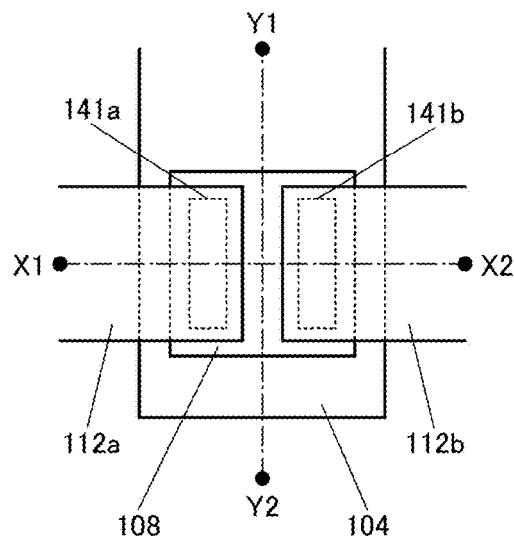
FIGS. 3A to 3C are a top view and cross-sectional views illustrating one embodiment of a semiconductor device.

FIG. 3A is a top view of a transistor 150 that is a semiconductor device of one embodiment of the present invention. FIG. 3B is a cross-sectional view taken along the dashed dotted line X1-X2 in FIG. 3A, and FIG. 3C is a cross-sectional view taken along the dashed dotted line Y1-Y2 in FIG. 3A.

The transistor 150 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, an insulating film 114 over the oxide semiconductor film 108, an insulating film 116 over the insulating film 114, a metal oxide film 132 over the insulating film 116, a metal oxide film 134 over the metal oxide film 132, a conductive film 112*a* functioning as a source electrode electrically connected to the oxide semiconductor film 108 through an opening 141*a* provided in the insulating films 114 and 116 and the metal oxide films 132 and 134, and a conductive film 112*b* functioning as a drain electrode electrically connected to the oxide semiconductor film 108 through an opening 141*b* provided in the insulating films 114 and 116 and the metal oxide films 132 and 134. The metal oxide film 132 contains at least one metal element that is the same as a metal element contained in the oxide semiconductor film 108. The metal oxide film 134 includes a region where the metal oxide film 134 is mixed with the metal oxide film 132.

Figure 3B:
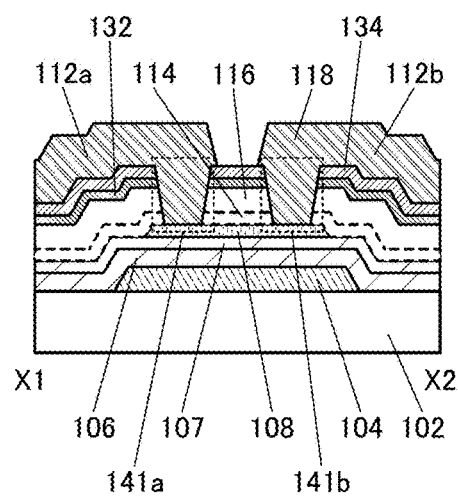
Figure 3C:
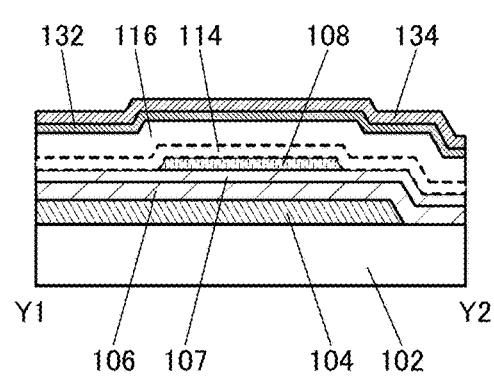

Although the transistor 100 described above has a channel-etched structure, the transistor 150 in FIGS. 3A to 3C has a channel-protective structure. Thus, the semiconductor device of one embodiment of the present invention can have either the channel-etched structure or the channel-protective structure.

As with the transistor 100 described above, the transistor 150 is provided with the insulating films 114 and 116 that are formed over the oxide semiconductor film 108; therefore, oxygen contained in the insulating films 114 and 116 can fill oxygen vacancies in the oxide semiconductor film 108. In addition, the provision of the metal oxide films 132 and 134 over the insulating film 116 makes it possible to inhibit entry of impurities into the oxide semiconductor film 108 from the outside. The other components of the transistor 150 are similar to those of the transistor 100 described above, and an effect similar to that of the transistor 100 can be obtained.

Structural Example 3 of Semiconductor Device

A structural example different from the transistor 150 in FIGS. 3A to 3C will be described with reference to FIGS. 4A to 4C. Note that in the case where a portion has a function similar to that described above, the same hatch pattern is applied to the portion, and the portion is not especially denoted by a reference numeral in some cases.

Figure 4A:
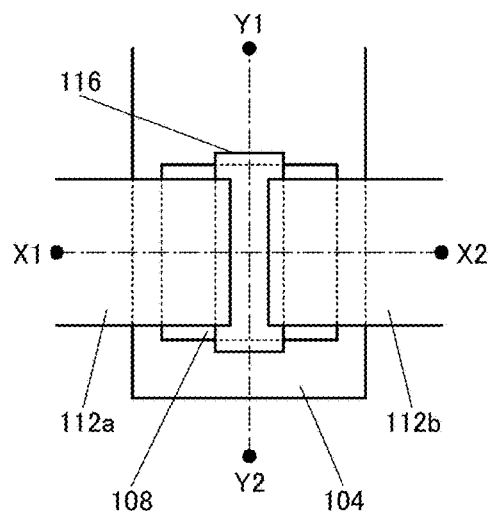
FIGS. 4A to 4C are a top view and cross-sectional views illustrating one embodiment of a semiconductor device.

FIG. 4A is a top view of a transistor 160 that is a semiconductor device of one embodiment of the present invention. FIG. 4B is a cross-sectional view taken along the dashed dotted line X1-X2 in FIG. 4A, and FIG. 4C is a cross-sectional view taken along the dashed dotted line Y1-Y2 in FIG. 4A.

The transistor 160 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, an insulating film 114 over the oxide semiconductor film 108, an insulating film 116 over the insulating film 114, a metal oxide film 132 over the insulating film 116, a metal oxide film 134 over the metal oxide film 132, a conductive film 112*a* functioning as a source electrode electrically connected to the oxide semiconductor film 108, and a conductive film 112*b* functioning as a drain electrode electrically connected to the oxide semiconductor film 108. The metal oxide film 132 contains at least one metal element that is the same as a metal element contained in the oxide semiconductor film 108. The metal oxide film 134 includes a region where the metal oxide film 134 is mixed with the metal oxide film 132.

Note that the transistor 160 is different from the transistor 150 in FIGS. 3A to 3C in the shapes of the insulating films 114 and 116 and the metal oxide films 132 and 134. Specifically, the insulating films 114 and 116 and the metal oxide films 132 and 134 of the transistor 160 have island shapes and are provided over a channel region of the oxide semiconductor film 108. The other components are similar to those of the transistor 150, and an effect similar to that of the transistor 150 can be obtained.

As with the transistor 100 described above, the transistor 160 is provided with the insulating films 114 and 116 over the oxide semiconductor film 108; therefore, oxygen contained in the insulating films 114 and 116 can fill oxygen vacancies in the oxide semiconductor film 108. Further, the provision of the metal oxide films 132 and 134 over the insulating film 116 makes it possible to inhibit entry of impurities into the oxide semiconductor film 108 from the outside.

Structural Example 4 of Semiconductor Device

A structural example different from the transistor 100 in FIGS. 1A to 1C will be described with reference to FIGS. 5A to 5C. Note that in the case where a portion has a function similar to that described above, the same hatch pattern is applied to the portion, and the portion is not especially denoted by a reference numeral in some cases.

Figure 5A:
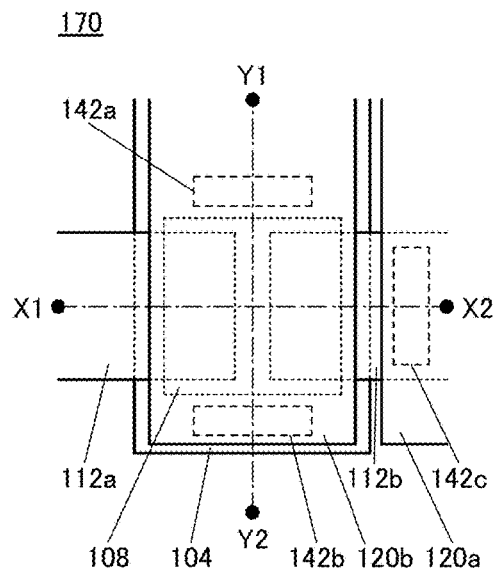
FIGS. 5A to 5C are a top view and cross-sectional views illustrating one embodiment of a semiconductor device.

FIG. 5A is a top view of a transistor 170 that is a semiconductor device of one embodiment of the present invention. FIG. 5B is a cross-sectional view taken along the dashed dotted line X1-X2 in FIG. 5A, and FIG. 5C is a cross-sectional view taken along the dashed dotted line Y1-Y2 in FIG. 5A.

The transistor 170 includes a conductive film 104 functioning as a first gate electrode over a substrate 102, an insulating film 106 over the substrate 102 and the conductive film 104, an insulating film 107 over the insulating film 106, an oxide semiconductor film 108 over the insulating film 107, a conductive film 112*a* functioning as a source electrode electrically connected to the oxide semiconductor film 108, a conductive film 112*b* functioning as a drain electrode electrically connected to the oxide semiconductor film 108, an insulating film 114 over the oxide semiconductor film 108 and the conductive films 112*a* and 112*b*, an insulating film 116 over the insulating film 114, a metal oxide film 132 over the insulating film 116, a metal oxide film 134 over the metal oxide film 132, and conductive films 120*a* and 120*b* over the metal oxide film 134.

As with the transistor 100, the transistor 170 is provided with the insulating films 114 and 116 over the oxide semiconductor film 108; therefore, oxygen contained in the insulating films 114 and 116 can fill oxygen vacancies in the oxide semiconductor film 108. Further, the provision of the metal oxide films 132 and 134 over the insulating film 116 makes it possible to inhibit entry of impurities into the oxide semiconductor film 108 from the outside.

In the transistor 170, the insulating films 114 and 116 and the metal oxide films 132 and 134 have a function of a second gate insulating film of the transistor 170. In the transistor 170, the conductive film 120*a* has a function of, for example, a pixel electrode used for a display device. The conductive film 120*a* is connected to the conductive film 112*b* through an opening 142*c* provided in the insulating films 114 and 116 and metal oxide films 132 and 134. In the transistor 170, the conductive film 120b functions as a second gate electrode (also referred to as a back gate electrode).

Figure 5B:
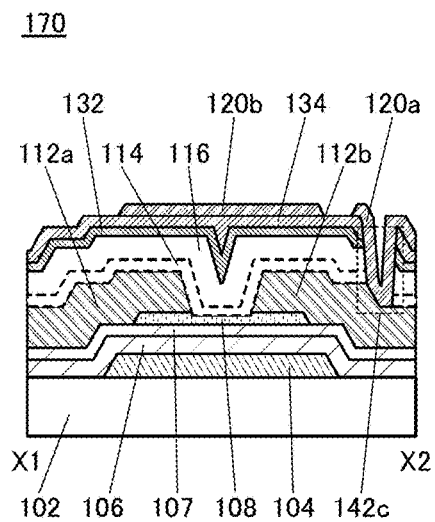
Figure 5C:
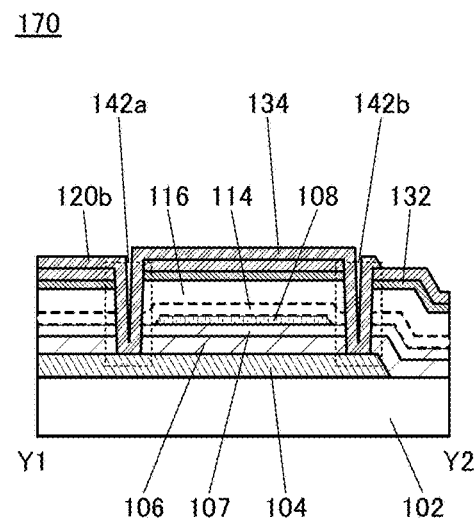

As illustrated in FIG. 5C, the conductive film 120b is connected to the conductive film 104 functioning as the first gate electrode through openings 142a and 142b provided in the insulating films 106, 107, 114, and 116 and the metal oxide films 132 and 134. Accordingly, the conductive film 120b and the conductive film 104 are supplied with the same potential.

Note that although the structure in which the openings 142a and 142b are provided so that the conductive film 120b and the conductive film 104 are connected to each other is described in this embodiment, one embodiment of the present invention is not limited thereto. For example, a structure in which only one of the openings 142a and 142b is provided so that the conductive film 120b and the conductive film 104 are connected to each other, or a structure in which the openings 142a and 142b are not provided and the conductive film 120b and the conductive film 104 are not connected to each other may be employed. Note that in the case where the conductive film 120b and the conductive film 104 are not connected to each other, it is possible to apply different potentials to the conductive film 120b and the conductive film 104.

As illustrated in FIG. 5B, the oxide semiconductor film 108 is positioned to be opposite each of the conductive film 104 functioning as the first gate electrode and the conductive film 120b functioning as the second gate electrode, and is sandwiched between the two conductive films functioning as gate electrodes. The lengths in the channel length direction and the channel width direction of the conductive film 120b functioning as the second gate electrode are longer than those in the channel length direction and the channel width direction of the oxide semiconductor film 108. The whole oxide semiconductor film 108 is covered with the conductive film 120b with the insulating films 114 and 116 and the metal oxide films 132 and 134 positioned therebetween. In addition, since the conductive film 120b functioning as the second gate electrode is connected to the conductive film 104 functioning as the first gate electrode through the openings 142a and 142b provided in the insulating films 106, 107, 114 and 116 and the metal oxide films 132 and 134; a side surface of the oxide semiconductor film 108 in the channel width direction faces the conductive film 120b functioning as the second gate electrode with the insulating films 114 and 116 and the metal oxide films 132 and 134 positioned therebetween.

In other words, the transistor 170 has the following structure in the channel width direction: the conductive film 104 functioning as the first gate electrode and the conductive film 120b functioning as the second gate electrode are connected to each other in the openings provided in the insulating films 106 and 107 functioning as a gate insulating film and the insulating films 114 and 116 and the metal oxide films 132 and 134 functioning as the second gate insulating film; and the conductive film 104 functioning as the first gate electrode and the conductive film 120b functioning as the second gate electrode surround the oxide semiconductor film 108, with the insulating films 106 and 107 functioning as the gate insulating film and the insulating films 114 and 116 and the metal oxide films 132 and 134 functioning as the second gate insulating film positioned between the conductive film 104 or 120b and the oxide semiconductor film 108.

Such a structure makes it possible that the oxide semiconductor film 108 included in the transistor 170 is electrically surrounded by electric fields of the conductive film 104 functioning as the first gate electrode and the conductive film 120b functioning as the second gate electrode. The device structure of a transistor, like that of the transistor 170, in which electric fields of a first gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as the first gate electrode; therefore, the current drive capability of the transistor 170 can improve and high on-state current characteristics can be obtained. In addition, since the on-state current can be increased, it is possible to reduce the size of the transistor 170. In addition, since the transistor 170 has a structure in which the oxide semiconductor film 108 is surrounded by the conductive film 104 functioning as the first gate electrode and the conductive film 120b functioning as the second gate electrode, the mechanical strength of the transistor 170 can be increased.

Structural Example 5 of Semiconductor Device

Structural examples different from the transistor 100 in FIGS. 1A to 1C will be described with reference to FIGS. 6A to 6D. Note that in the case where a portion has a function similar to that described above, the same hatch pattern is applied to the portion, and the portion is not especially denoted by a reference numeral in some cases.

FIGS. 6A to 6D are cross-sectional views illustrating variations of the transistor 100 in FIGS. 1B and 1C.

Figure 6A:
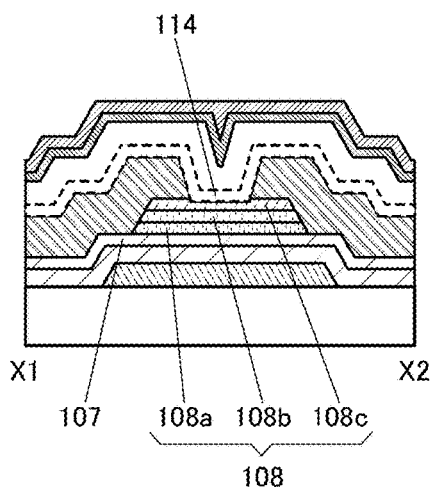
FIGS. 6A to 6D are cross-sectional views illustrating embodiments of a semiconductor device.
Figure 6B:
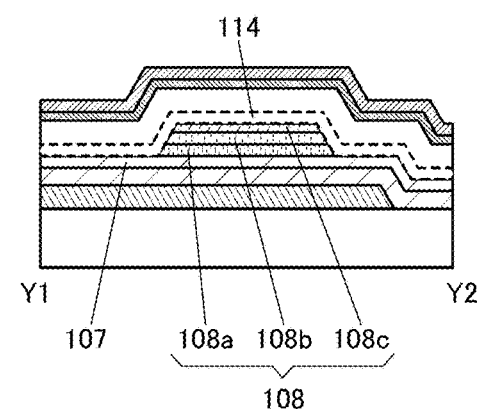

A transistor 100A in FIGS. 6A and 6B has the same structure as the transistor 100 in FIGS. 1B and 1C except that the oxide semiconductor film 108 has a three-layer structure. Specifically, the oxide semiconductor film 108 of the transistor 100A includes an oxide semiconductor film 108a, an oxide semiconductor film 108b, and an oxide semiconductor film 108c.

Figure 6C:
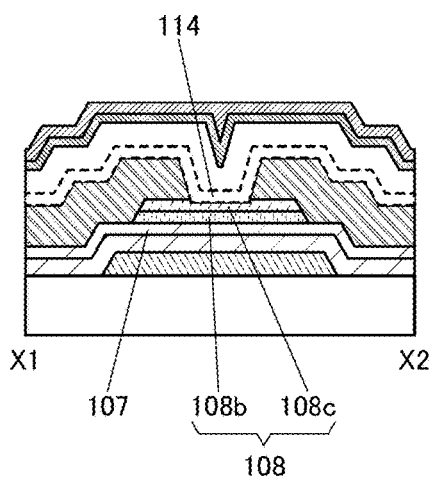
Figure 6D:
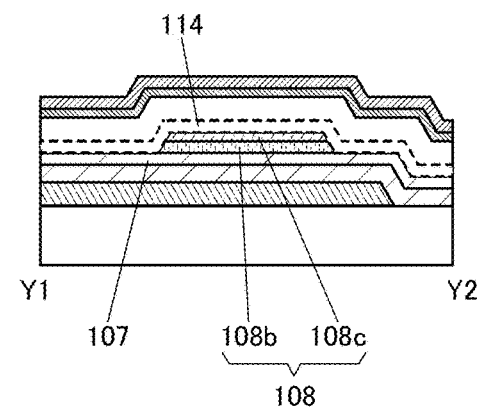

A transistor 100B in FIGS. 6C and 6D has the same structure as the transistor 100 in FIGS. 1B and 1C except that the oxide semiconductor film 108 has a two-layer structure. Specifically, the oxide semiconductor film 108 of the transistor 100B includes an oxide semiconductor film 108b and an oxide semiconductor film 108c.

Here, a band structure including the oxide semiconductor films 108a, 108b, and 108c and the insulating films in contact with the oxide semiconductor films 108b and 108c is described with reference to FIGS. 7A and 7B.

Figure 7A:
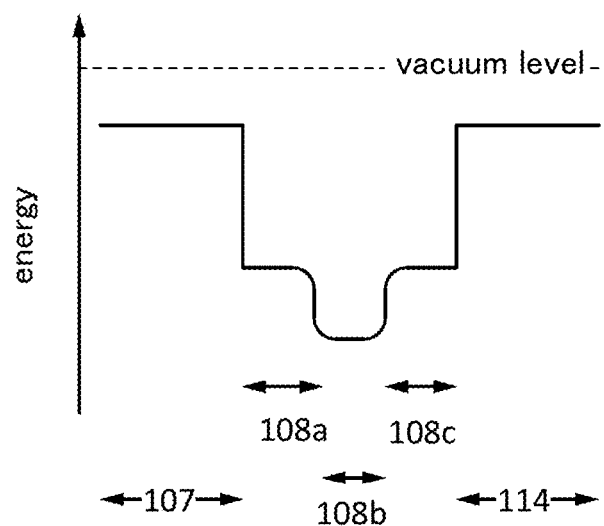
FIGS. 7A and 7B are band diagrams.

FIG. 7A shows an example of a band structure in the thickness direction of a stack including the insulating film 107, the oxide semiconductor films 108a, 108b, and 108c, and the insulating film 114. FIG. 7B shows an example of a band structure in the thickness direction of a stack including the insulating film 107, the oxide semiconductor films 108b and 108c, and the insulating film 114. For easy understanding, the conduction band minimum (Ec) of each of the insulating film 107, the oxide semiconductor films 108a, 108b, and 108c, and the insulating film 114 is shown in the band diagrams.

In the band structure of FIG. 7A, a silicon oxide film is used as each of the insulating films 107 and 114, an oxide semiconductor film formed using a metal oxide target having an atomic ratio of metal elements of In:Ga:Zn=1:3:2 is used as the oxide semiconductor film 108a, an oxide semiconductor film formed using a metal oxide target having an atomic ratio of metal elements of In:Ga:Zn=1:1:1 is used as the oxide semiconductor film 108b, and an oxide semiconductor film formed using a metal oxide target having an atomic ratio of metal elements of In:Ga:Zn=1:3:2 is used as the oxide semiconductor film 108c.

Figure 7B:
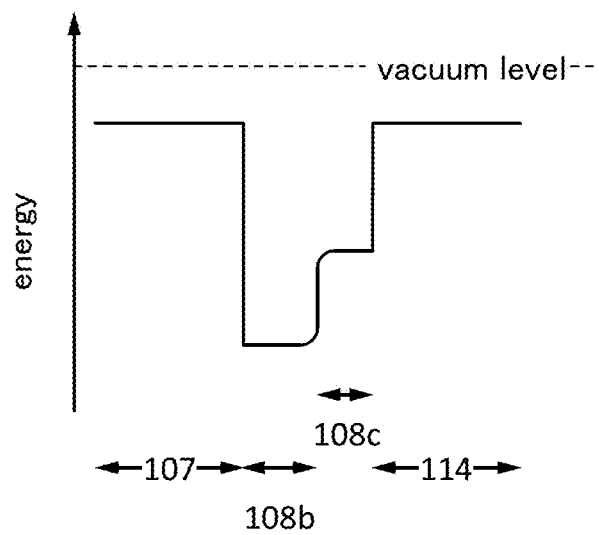

In the band structure of FIG. 7B, a silicon oxide film is used as each of the insulating films 107 and 114, an oxide semiconductor film formed using a metal oxide target having an atomic ratio of metal elements of In:Ga:Zn=1:1:1 is used as the oxide semiconductor film 108b, and a metal oxide film formed using a metal oxide target having an atomic ratio of metal elements of In:Ga:Zn=1:3:2 is used as the oxide semiconductor film 108c.

As illustrated in FIGS. 7A and 7B, the energy level of the conduction band minimum gradually varies between the oxide semiconductor film 108a and the oxide semiconductor film 108b and between the oxide semiconductor film 108b and the oxide semiconductor film 108c. In other words, the energy level at the bottom of the conduction band is continuously varied or continuously connected. To obtain such a band structure, there exists no impurity, which forms a defect state such as a trap center or a recombination center, at the interface between the oxide semiconductor film 108a and the oxide semiconductor film 108b or at the interface between the oxide semiconductor film 108b and the oxide semiconductor film 108c.

To form a continuous junction between the oxide semiconductor film 108a and the oxide semiconductor film 108b and between the oxide semiconductor film 108b and the oxide semiconductor film 108c, it is necessary to form the films successively without exposure to the air by using a multi-chamber deposition apparatus (sputtering apparatus) provided with a load lock chamber.

With the band structure of FIG. 7A or FIG. 7B, the oxide semiconductor film 108b serves as a well, and a channel region is formed in the oxide semiconductor film 108b in the transistor with the stacked-layer structure.

The provision of the oxide semiconductor film 108a and/or the oxide semiconductor film 108c enables the oxide semiconductor film 108b to be distanced away from trap states.

In addition, the trap states might be more distant from the vacuum level than the energy level of the conduction band minimum (Ec) of the oxide semiconductor film 108b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum (Ec) of the oxide semiconductor film 108b. Such a structure inhibits accumulation of electrons in the trap states. As a result, the on-state current and the field-effect mobility of the transistor can be increased.

In FIGS. 7A and 7B, the energy level of the conduction band minimum of each of the oxide semiconductor films 108a and 108c is closer to the vacuum level than that of the oxide semiconductor film 108b. Typically, a difference in energy level between the conduction band minimum of the oxide semiconductor film 108b and the conduction band minimum of each of the oxide semiconductor films 108a and 108c is 0.15 eV or more or 0.5 eV or more and 2 eV less or 1 eV or less. That is, the difference between the electron affinity of each of the oxide semiconductor films 108a and 108c and the electron affinity of the oxide semiconductor film 108b is 0.15 eV or more or 0.5 eV or more and 2 eV or less or 1 eV or less.

In such a structure, the oxide semiconductor film 108b serves as a main path of current and functions as a channel region. In addition, since the oxide semiconductor films 108a and 108c each contain one or more metal elements that are the same as those contained in the oxide semiconductor film 108b in which a channel region is formed, interface scattering is less likely to occur at the interface between the oxide semiconductor film 108a and the oxide semiconductor film 108b or at the interface between the oxide semiconductor film 108b and the oxide semiconductor film 108c. Thus, the transistor can have high field-effect mobility because the movement of carriers is not hindered at the interface.

To prevent each of the oxide semiconductor films 108a and 108c from functioning as part of a channel region, a material having sufficiently low conductivity is used for the oxide semiconductor films 108a and 108c. Alternatively, a material which has a smaller electron affinity (a difference in energy level between the vacuum level and the conduction band minimum) than the oxide semiconductor film 108b and has a difference in energy level in the conduction band minimum from the oxide semiconductor film 108b (band offset) is used for the oxide semiconductor films 108a and 108c. Furthermore, to inhibit generation of a difference between threshold voltages due to the value of the drain voltage, it is preferable to form the oxide semiconductor films 108a and 108c using a material whose energy level of the conduction band minimum is closer to the vacuum level than that of the oxide semiconductor film 108b by 0.2 eV or more, preferably 0.5 eV or more.

It is preferable that the oxide semiconductor films 108a and 108c not have a spinel crystal structure. This is because if the oxide semiconductor films 108a and 108c have a spinel crystal structure, constituent elements of the conductive films 112a and 112b might be diffused to the oxide semiconductor film 108b at the interface between the spinel crystal structure and another region. Note that each of the oxide semiconductor films 108a and 108c is preferably a CAAC-OS, which will be described later, in which case a higher blocking property against constituent elements of the conductive films 112a and 112b, for example, copper elements, is obtained.

The thickness of each of the oxide semiconductor films 108a and 108c is greater than or equal to a thickness that is capable of inhibiting diffusion of the constituent elements of the conductive films 112a and 112b to the oxide semiconductor film 108b, and less than a thickness that inhibits supply of oxygen from the insulating film 114 to the oxide semiconductor film 108b. For example, when the thickness of each of the oxide semiconductor films 108a and 108c is greater than or equal to 10 nm, diffusion of the constituent elements of the conductive films 112a and 112b to the oxide semiconductor film 108b can be inhibited. When the thickness of each of the oxide semiconductor films 108a and 108c is less than or equal to 100 nm, oxygen can be effectively supplied from the insulating films 114 and 116 to the oxide semiconductor film 108b.

When the oxide semiconductor films 108a and 108c are each an In-M-Zn oxide in which the atomic ratio of the element M (M is Ti, Ga, Y, Zr, La, Ce, Nd, or Hf) is higher than that of In, the energy gap of each of the oxide semiconductor films 108a and 108c can be large and the electron affinity thereof can be small. Therefore, a difference in electron affinity between the oxide semiconductor film 108b and each of the oxide semiconductor films 108a and 108c may be controlled by the proportion of the element M. Furthermore, an oxygen vacancy is less likely to be generated in the oxide semiconductor layer in which the atomic ratio of Ti, Ga, Y, Zr, La, Ce, Nd, or Hf is higher than that of In because Ti, Ga, Y, Zr, La, Ce, Nd, and Hf are each a metal element that is strongly bonded to oxygen.

When an In-M-Zn oxide is used for the oxide semiconductor films 108a and 108c, the proportions of In and M, not taking Zn and O into consideration, are as follows: the atomic percentage of In is preferably less than 50 atomic % and the atomic percentage of M is greater than 50 atomic % and further preferably the atomic percentage of In is less than 25 atomic % and the atomic percentage of M is greater than 75 atomic %. Alternatively, a gallium oxide film may be used as each of the oxide semiconductor films 108a and 108c.

Furthermore, in the case where each of the oxide semiconductor films 108a, 108b, and 108c is an In-M-Zn oxide, the proportion of M atoms in each of the oxide semiconductor films 108a and 108c is higher than that in the oxide semiconductor film 108b. Typically, the proportion of M atoms in each of the oxide semiconductor films 108a and 108c is 1.5 or more times, preferably twice or more times, or further preferably three or more times as high as that in the oxide semiconductor film 108b.

Furthermore, in the case where the oxide semiconductor films 108a, 108b, and 108c are each an In-M-Zn oxide, when the oxide semiconductor film 108b has an atomic ratio of In:M:Zn=$x_1$:$y_1$:$z_1$ and the oxide semiconductor films 108a and 108c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, or still further preferably $y_2/x_2$ is three or more times or four or more times as large as $y_1/x_1$. In this case, it is preferable that in the oxide semiconductor film 108b, $y_1$ be higher than or equal to $x_1$ because a transistor including the oxide semiconductor film 108b can have stable electric characteristics. However, when $y_1$ is three or more times as large as $x_1$, the field-effect mobility of the transistor including the oxide semiconductor film 108b is reduced. Accordingly, $y_1$ is preferably smaller than three times $x_1$.

In the case where the oxide semiconductor film 108b is an In-M-Zn oxide and a target having the atomic ratio of metal elements of In:M:Zn=$x_1$:$y_1$:$z_1$ is used for depositing the oxide semiconductor film 108b, $x_1/y_1$ is preferably greater than or equal to ⅓ and less than or equal to 6, or further preferably greater than or equal to 1 and less than or equal to 6, and $z_1/y_1$ is preferably greater than or equal to ⅓ and less than or equal to 6, or further preferably greater than or equal to 1 and less than or equal to 6. Note that when $z_1/y_1$ is greater than or equal to 1 and less than or equal to 6, a CAAC-OS to be described later is easily formed as the oxide semiconductor film 108b. Typical examples of the atomic ratio of the metal elements of the target include In:M:Zn=1:1:1, In:M:Zn=1:1:1.2, and In:M:Zn=3:1:2.

In the case where the oxide semiconductor films 108a and 108c are each an In-M-Zn oxide and a target having an atomic ratio of metal elements of In:M:Zn=$x_2$:$y_2$:$z_2$ is used for depositing the oxide semiconductor films 108a and 108c, $x_2/y_2$ is preferably less than $x_1/y_1$, and $z_2/y_2$ is preferably greater than or equal to ⅓ and less than or equal to 6, or further preferably greater than or equal to 1 and less than or equal to 6. When the atomic ratio of M with respect to indium is high, the energy gap of the oxide semiconductor films 108a and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 108a and 108c are each an In-M oxide, when a divalent metal element (e.g., zinc) is not included as M, the oxide semiconductor films 108a and 108c which do not include a spinel crystal structure can be formed. As each of the oxide semiconductor films 108a and 108c, for example, an In—Ga oxide film can be used. The In—Ga oxide can be formed by a sputtering method using an In—Ga metal oxide target (In:Ga=7:93), for example. To deposit the oxide semiconductor films 108a and 108c by a sputtering method using DC discharge, on the assumption that an atomic ratio of In:M is x:y, it is preferable that y/(x+y) be less than or equal to 0.96, or further preferably less than or equal to 0.95, for example, 0.93.

In each of the oxide semiconductor films 108a, 108b, and 108c, the proportions of the atoms in the above atomic ratio vary within a range of ±40% as an error.

The structures of the transistors of this embodiment can be freely combined with each other.

<Method 1 for Manufacturing Semiconductor Device>

Next, a method for manufacturing the transistor 100 that is a semiconductor device of one embodiment of the present invention will be described with reference to FIGS. 8A to 8C, FIGS. 9A to 9C, and FIGS. 10A and 10B. Note that FIGS. 8A to 8C, FIGS. 9A to 9C, and FIGS. 10A and 10B are cross-sectional views illustrating the method for manufacturing the semiconductor device.

Figure 8A:
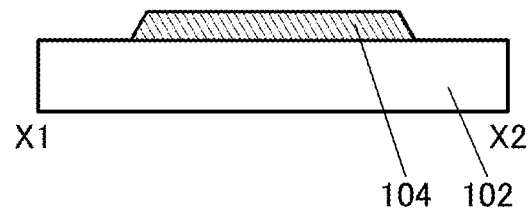
FIGS. 8A to 8C are cross-sectional views illustrating an example of a manufacturing process of a semiconductor device.

First, a conductive film is formed over the substrate 102 and processed through a lithography process and an etching process, whereby the conductive film 104 functioning as a gate electrode is formed (see FIG. 8A).

In this embodiment, a glass substrate is used as the substrate 102, and as the conductive film 104 functioning as a gate electrode, a 100-nm-thick tungsten film is formed by a sputtering method.

Figure 8B:
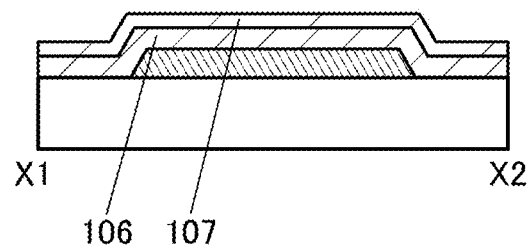

Then, the insulating films 106 and 107 functioning as gate insulating films are formed over the conductive film 104 (see FIG. 8B).

In this embodiment, a 400-nm-thick silicon nitride film as the insulating film 106 and a 50-nm-thick silicon oxynitride film as the insulating film 107 are formed by a PECVD method.

The insulating film 106 has a stacked-layer structure of silicon nitride films. Specifically, the insulating film 106 can have a three-layer stacked-layer structure of a first silicon nitride film, a second silicon nitride film, and a third silicon nitride film. An example of the three-layer stacked-layer structure can be formed as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the condition where silane at a flow rate of 200 sccm, nitrogen at a flow rate of 2000 sccm, and an ammonia gas at a flow rate of 2000 sccm are supplied as a source gas to the reaction chamber of the PECVD apparatus; the pressure in the reaction chamber is controlled to 100 Pa, and a power of 2000 W is supplied using a 27.12 MHz high-frequency power source.

The third silicon nitride film can be formed to have a thickness of 50 nm under the condition where silane at a flow rate of 200 sccm and nitrogen at a flow rate of 5000 sccm are supplied as a source gas to the reaction chamber of the PECVD apparatus; the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can be each formed at a substrate temperature of 350° C.

When the insulating film 106 has the three-layer stacked-layer structure of silicon nitride films, for example, in the case where a conductive film containing copper (Cu) is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film containing oxygen to improve characteristics of an interface with the oxide semiconductor film 108 formed later.

Figure 8C:
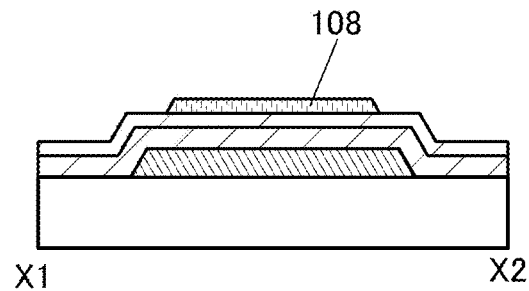

Next, the oxide semiconductor film 108 is formed over the insulating film 107 (see FIG. 8C).

In this embodiment, an oxide semiconductor film is formed by a sputtering method using an In—Ga—Zn metal oxide target (having an atomic ratio of In:Ga:Zn=1:1:1.2), a mask is formed over the oxide semiconductor film through a lithography process, and the oxide semiconductor film is processed into a desired shape, whereby the oxide semiconductor film 108 having an island shape is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C., further preferably higher than or equal to 300° C. and lower than or equal to 450° C. The heat treatment performed here serves as one kind of treatment for increasing the purity of the oxide semiconductor film and can reduce hydrogen, water, and the like contained in the oxide semiconductor film 108. Note that the heat treatment for the purpose of reducing hydrogen, water, and the like may be performed before the oxide semiconductor film 108 is processed into an island shape.

A gas baking furnace, an electric furnace, a rapid thermal annealing (RTA) apparatus, or the like can be used for the heat treatment to which the oxide semiconductor film 108 is subjected. With the use of an RTA apparatus, the heat treatment can be performed at a temperature higher than or equal to the strain point of the substrate if the heating time is short. Therefore, the heat treatment time can be shortened.

The heat treatment to which the oxide semiconductor film 108 is subjected may be performed in an atmosphere of nitrogen gas, oxygen gas, clean dry air (also referred to as CDA, which is an air with a water content of 20 ppm or less, preferably 1 ppm or less, further preferably 10 ppb or less), or rare gas (e.g., argon or helium). The atmosphere of nitrogen gas, oxygen gas, CDA, or rare gas preferably does not contain hydrogen, water, and the like.

The purity of the nitrogen gas, the oxygen gas, or CDA is preferably increased, for example. Specifically, the purity of the nitrogen gas, the oxygen gas, or CDA is preferably 6N (99.9999%) or 7N (99.99999%). When a gas which is highly purified to have a dew point of −60° C. or lower, preferably −100° C. or lower, is used as the nitrogen gas, the oxygen gas, or CDA, entry of moisture and the like into the oxide semiconductor film 108 can be minimized.

Further, the oxide semiconductor film 108 may be subjected to another heat treatment in an oxygen atmosphere or a CDA atmosphere after the heat treatment in a nitrogen atmosphere or a rare gas atmosphere. As a result, hydrogen, water, and the like can be released from the oxide semiconductor film 108 and oxygen can be supplied to the oxide semiconductor film 108 at the same time. Consequently, the amount of oxygen vacancies in the oxide semiconductor film 108 can be reduced.

Here, thermal profiles of heat treatment performed on the oxide semiconductor film 108 in a gas baking furnace will be described with reference to FIGS. 16A and 16B and FIGS. 17A and 17B. FIGS. 16A and 16B and FIGS. 17A and 17B each show a thermal profile of heat treatment in a gas baking furnace.

Note that each of FIGS. 16A and 16B and FIGS. 17A and 17B is a thermal profile showing the temperature raised to a predetermined temperature (here, 450° C.; hereinafter referred to as a first temperature) and dropped to a predetermined temperature (here, higher than or equal to room temperature and lower than or equal to 150° C.; hereinafter referred to as a second temperature).

Figure 16A:
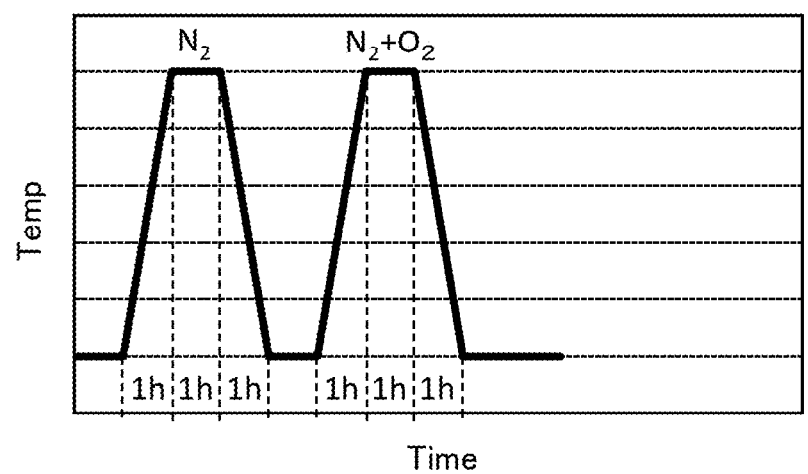
FIGS. 16A and 16B each show a thermal profile of heat treatment in a gas baking furnace.

When the oxide semiconductor film 108 is subjected to heat treatment, the treatment can be divided into two steps using two kinds of gases as shown in FIG. 16A. For example, a nitrogen gas is introduced into a gas baking furnace in the first step. Then, the temperature is raised to the first temperature over one hour, and the heat treatment is performed at the first temperature for another one hour. After that, the temperature is dropped to the second temperature over the next one hour. In the second step, the nitrogen gas is replaced by a mixed gas of nitrogen and oxygen. Then, the time taken to raise the temperature to the first temperature is one hour, and the heat treatment is performed at the first temperature for another one hour. After that, the temperature is dropped to the second temperature over the next one hour.

Figure 16B:
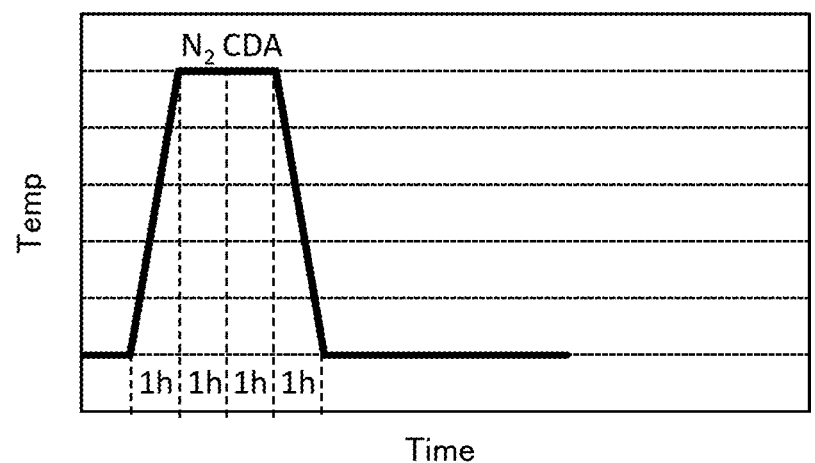

Alternatively, when the oxide semiconductor film 108 is subjected to heat treatment, the treatment can be performed in one step using two kinds of gases as shown in FIG. 16B. For example, first, a nitrogen gas is introduced into a gas baking furnace. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour.

The thermal profile of the heat treatment in the gas baking furnace shown in FIG. 16B requires less processing time than the thermal profile of the heat treatment in the gas baking furnace shown in FIG. 16A; accordingly, semiconductor devices can be provided with higher productivity.

Figure 17A:
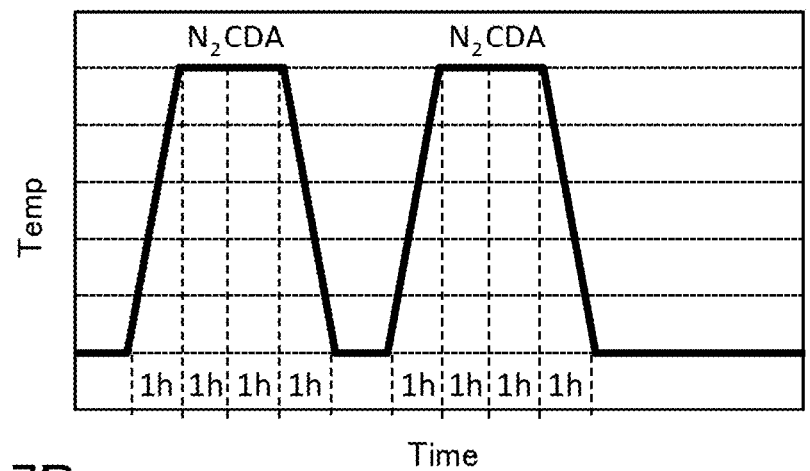
FIGS. 17A and 17B each show a thermal profile of heat treatment in a gas baking furnace.

Alternatively, when the oxide semiconductor film 108 is subjected to heat treatment, the treatment can be performed in two steps using two kinds of gases as shown in FIG. 17A. For example, first, a nitrogen gas is introduced into a gas baking furnace in the first step. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour. In the second step, CDA is replaced by a nitrogen gas. Then, the temperature is raised to the first temperature over one hour, and the heat treatment is performed at the first temperature for another one hour. After that, the gas is changed from the nitrogen gas to CDA. After the gas change, the heat treatment is performed for another one hour, and the temperature is dropped to the second temperature over the next one hour.

Figure 17B:
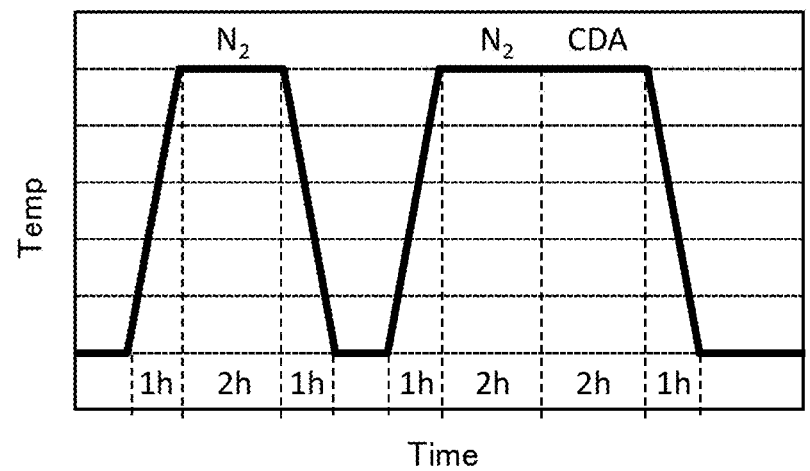

Alternatively, when the oxide semiconductor film 108 is subjected to heat treatment, the treatment can be performed in two steps using two kinds of gases as shown in FIG. 17B. For example, first, a nitrogen gas is introduced into a gas baking furnace in the first step. Then, the temperature is raised to the first temperature over one hour, and the heat treatment is performed at the first temperature for two hours. After that, the temperature is dropped to the second temperature over the next one hour. In the second step, the temperature is raised to the first temperature over one hour, and the heat treatment is performed at the first temperature for two hours. After that, the gas is changed from the nitrogen gas to CDA. After the gas change, the heat treatment is performed for another two hours, and then the temperature is dropped to the second temperature over the next one hour.

As far as the thermal profiles of heat treatment performed on the oxide semiconductor film 108 in a gas baking furnace are concerned, it is preferable that the oxide semiconductor film 108 be first heated in a nitrogen gas as shown in FIGS. 16A and 16B and FIGS. 17A and 17B.

When the oxide semiconductor film 108 is first heated in a nitrogen gas, oxygen, which is one of the principal components of the oxide semiconductor film 108, and hydrogen in the oxide semiconductor film 108 react with each other to form an OH group. Then, the OH group is released from the surface of the oxide semiconductor film 108 as $H_2O$. In other words, owing to the first nitrogen gas, hydrogen in the oxide semiconductor film 108 can be captured.

However, heating the oxide semiconductor film 108 with only a nitrogen gas makes oxygen be released from the oxide semiconductor film 108 as $H_2O$, whereby oxygen vacancies are formed in the oxide semiconductor film 108.

Thus, the nitrogen gas is replaced by either a mixed gas of nitrogen and oxygen or CDA as shown in FIGS. 16A and 16B and FIGS. 17A and 17B, in which case oxygen contained in the gas can fill the oxygen vacancies in the oxide semiconductor film 108.

Note that although the heat treatment is performed for one or two consecutive hours after the temperature becomes stable at the predetermined temperature in FIGS. 16A and 16B and FIGS. 17A and 17B, one embodiment of the present invention is not limited thereto. For example, the processing time of heat treatment in the nitrogen gas in the first step in FIG. 17B may be one to 10 hours inclusive. As the processing time of the first step in FIG. 17B is increased, a larger amount of hydrogen can be released from the oxide semiconductor film 108, which is preferable.

In addition, time for baking with the use of either a mixed gas of nitrogen and oxygen or CDA may be set longer (e.g., one to 10 hours inclusive) as necessary. Increasing the heating time in an oxygen-containing atmosphere makes it possible to favorably fill the oxygen vacancies formed in the oxide semiconductor film 108.

In the case where the oxide semiconductor film is formed by a sputtering method, a rare gas (typically argon), oxygen, or a mixed gas of a rare gas and oxygen is used as a sputtering gas, as appropriate. In the case where the mixed gas of a rare gas and oxygen is used, the proportion of oxygen to a rare gas is preferably increased. In addition, increasing the purity of a sputtering gas is necessary. For example, as an oxygen gas or an argon gas used for a sputtering gas, a gas that is highly purified to have a dew point of $-60°$ C. or lower, further preferably $-100°$ C. or lower is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas containing carbon or hydrogen from an exhaust system to the inside of the chamber.

Figure 9A:
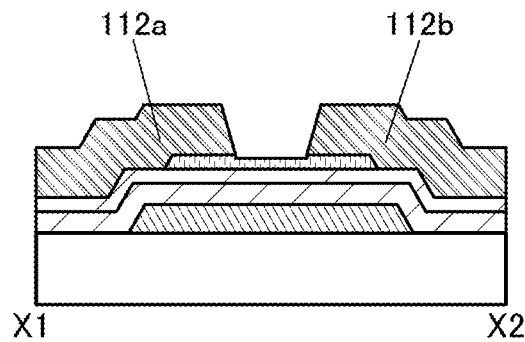
FIGS. 9A to 9C are cross-sectional views illustrating an example of a manufacturing process of a semiconductor device.

Next, the conductive films 112a and 112b functioning as source and drain electrodes are formed over the insulating film 107 and the oxide semiconductor film 108 (see FIG. 9A).

In this embodiment, the conductive films 112a and 112b are formed in the following manner: a stack including a 50-nm-thick tungsten film and a 400-nm-thick aluminum film is formed by a sputtering method, a mask is formed over the stack through a lithography process, and the stack is processed into desired shapes. Although the conductive films 112a and 112b each have a two-layer stacked-layer structure in this embodiment, one embodiment of the present invention is not limited thereto. For example, the conductive films 112a and 112b each may have a three-layer stacked-layer structure including a 50-nm-thick tungsten film, a 400-nm-thick aluminum film, and a 100-nm-thick titanium film.

After the conductive films 112a and 112b are formed, a surface of the oxide semiconductor film 108 (on a back channel side) may be cleaned. The cleaning may be performed, for example, using a chemical solution such as phosphoric acid. The cleaning using a chemical solution such as a phosphoric acid can remove impurities (e.g., an element contained in the conductive films 112a and 112b) attached to the surface of the oxide semiconductor film 108.

Note that a recessed portion might be formed in part of the oxide semiconductor film 108 in the step of forming the conductive films 112a and 112b and/or the cleaning step.

Through the above steps, the transistor 100 is formed.

Figure 9B:
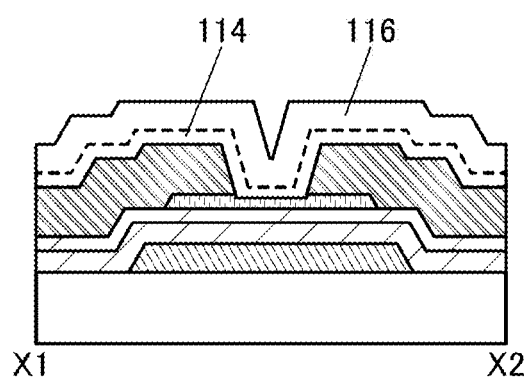

Next, over the transistor 100, specifically, over the oxide semiconductor film 108 and the conductive films 112a and 112b, the insulating films 114 and 116 functioning as protective insulating films of the transistor 100 are formed (see FIG. 9B).

Note that after the insulating film 114 is formed, the insulating film 116 is preferably formed in succession without exposure to the air. After the insulating film 114 is formed, the insulating film 116 is formed in succession without exposure to the air while at least one of the flow rate of a source gas, pressure, a high-frequency power, and a substrate temperature is adjusted, whereby the concentration of impurities attributed to the atmospheric component at the interface between the insulating film 114 and the insulating film 116 can be reduced and oxygen in the insulating films 114 and 116 can be moved to the oxide semiconductor film 108; accordingly, the amount of oxygen vacancies in the oxide semiconductor film 108 can be reduced.

As the insulating film 114, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PECVD method under the conditions where the ratio of the oxidizing gas to the deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the following conditions: the substrate placed in a treatment chamber of the PECVD apparatus that is vacuum-evacuated is held at a temperature higher than or equal to 180° C. and lower than or equal to 280° C., preferably higher than or equal to 200° C. and lower than or equal to 240° C.; the pressure is greater than or equal to 100 Pa and less than or equal to 250 Pa, preferably greater than or equal to 100 Pa and less than or equal to 200 Pa with introduction of a source gas into the treatment chamber; and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film which contains oxygen at a higher proportion than the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating layer in which the amount of defects is small, i.e., the spin density of a signal which appears at g=2.001 originating from a dangling bond of silicon is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor can be improved.

Heat treatment may be performed after the insulating films 114 and 116 are formed. The heat treatment can reduce nitrogen oxide contained in the insulating films 114 and 116. By the heat treatment, part of oxygen contained in the insulating films 114 and 116 can be moved to the oxide semiconductor film 108, so that the amount of oxygen vacancies included in the oxide semiconductor film 108 can be reduced.

The temperature of the heat treatment performed on the insulating films 114 and 116 is typically higher than or equal to 150° C. and lower than or equal to 400° C., preferably higher than or equal to 300° C. and lower than or equal to 400° C., further preferably higher than or equal to 320° C. and lower than or equal to 370° C. The heat treatment may be performed under an atmosphere of nitrogen, oxygen, CDA, or a rare gas (argon, helium, and the like). Note that a gas baking furnace, an electric furnace, an RTA apparatus, or the like can be used for the heat treatment, in which it is preferable that hydrogen, water, and the like not be contained in the nitrogen, oxygen, ultra-dry air, or a rare gas.

In this embodiment, the heat treatment is performed at 350° C. for one hour in an atmosphere of nitrogen and oxygen.

Figure 9C:
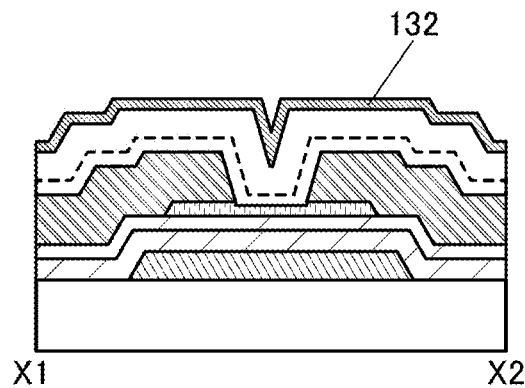

Then, the metal oxide film 132 is formed over the insulating film 116 (see FIG. 9C).

The metal oxide film 132 can be formed using a conductive film containing indium or a semiconductor film containing indium. In this embodiment, a 5-nm-thick ITSO film is formed, as the metal oxide film 132, with the use of a sputtering apparatus. Note that the thickness of the metal oxide film 132 is preferably greater than or equal to 1 nm and less than or equal to 20 nm, or greater than or equal to 2 nm and less than or equal to 10 nm, in which case oxygen is favorably transmitted and release of oxygen can be inhibited.

Figure 10A:
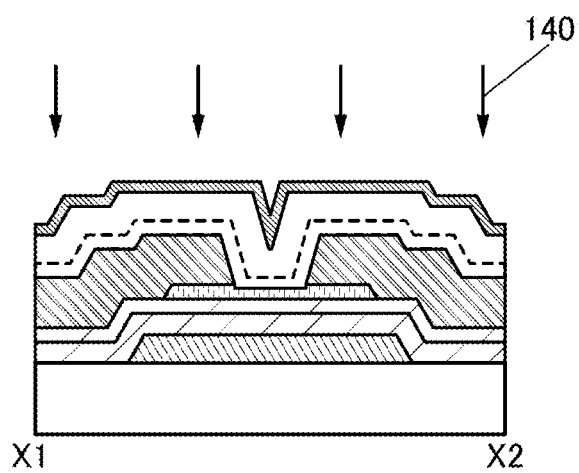
FIGS. 10A and 10B are cross-sectional views illustrating an example of a manufacturing process of a semiconductor device.

Next, oxygen 140 is introduced into the insulating films 114 and 116 through the metal oxide film 132 (see FIG. 10A).

Examples of the method for introducing the oxygen 140 into the insulating films 114 and 116 through the metal oxide film 132 include an ion doping method, an ion implantation method, and a plasma treatment method. For the plasma treatment method, high-density plasma may be generated by exciting oxygen with a microwave.

By application of a bias voltage to the substrate side when the oxygen 140 is introduced, the oxygen 140 can be effectively introduced into the insulating films 114 and 116. With the use of an ashing apparatus, for example, power density of the bias voltage applied to the substrate side of the ashing apparatus may be greater than or equal to 1 W/cm$^2$ and less than or equal to 5 W/cm$^2$. The substrate temperature during introduction of the oxygen 140 is higher than room temperature and lower than 350° C., preferably higher than or equal to 100° C. and lower than or equal to 250° C., whereby the oxygen can be introduced efficiently into the insulating films 114 and 116.

In this embodiment, an ashing apparatus is used. An 02 gas is introduced into the ashing apparatus and a bias is applied to the substrate side, whereby the oxygen 140 is introduced into the insulating films 114 and 116.

Oxygen is introduced into the insulating films 114 and 116 with the metal oxide film 132 provided thereover; thus, the metal oxide film 132 functions as a protective film that inhibits oxygen from being released from the insulating films 114 and 116. Accordingly, a larger amount of oxygen can be introduced into the insulating films 114 and 116.

Figure 10B:
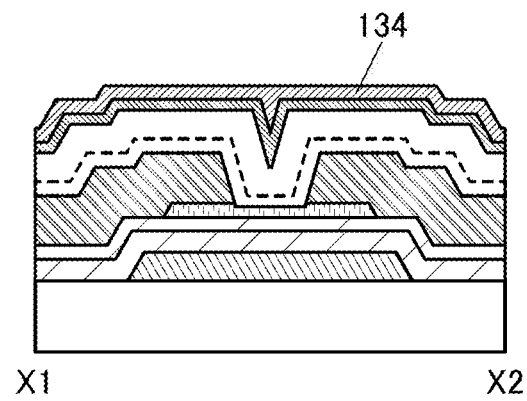

Next, the metal oxide film 134 is formed over the metal oxide film 132, whereby the transistor 100 in FIGS. 1A to 1C is formed (see FIG. 10B).

A conductive film containing aluminum, an insulating film containing aluminum, or the like can be used as the metal oxide film 134. For example, aluminum is deposited by a sputtering method as a conductive film over the metal oxide film 132, and the deposited aluminum is subjected to oxygen plasma treatment or heat treatment in an oxygen atmosphere, whereby an aluminum oxide film can be formed as the metal oxide film 134 over the metal oxide film 132. Alternatively, an aluminum oxide film is formed by an ALD method as an insulating film over the metal oxide film 132, whereby an aluminum oxide film as the metal oxide film 134 can be formed over the metal oxide film 132.

Further, heat treatment may be performed after the formation of the metal oxide films 132 and 134, so that excess oxygen contained in the insulating films 114 and 116 can be diffused into the oxide semiconductor film 108 to fill oxygen vacancies in the oxide semiconductor film 108. Alternatively, either one of or each of the metal oxide films 132 and 134 is formed by thermal deposition, so that excess oxygen contained in the insulating films 114 and 116 can be diffused into the oxide semiconductor film 108 to fill oxygen vacancies in the oxide semiconductor film 108. The temperature of the heat treatment that can be performed after the formation of the metal oxide films 132 and 134 is typically higher than or equal to 150° C. and lower than or equal to 400° C., preferably higher than or equal to 300° C. and lower than or equal to 400° C., and further preferably higher than or equal to 320° C. and lower than or equal to 370° C.

Through the above-described process, the transistor 100 illustrated in FIGS. 1A to 1C can be fabricated.

<Method 2 for Manufacturing Semiconductor Device>

Figure 11A:
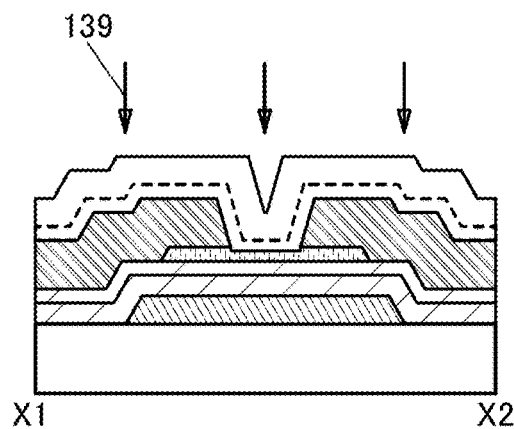
FIGS. 11A to 11C are cross-sectional views illustrating an example of a manufacturing process of a semiconductor device.
Figure 11B:
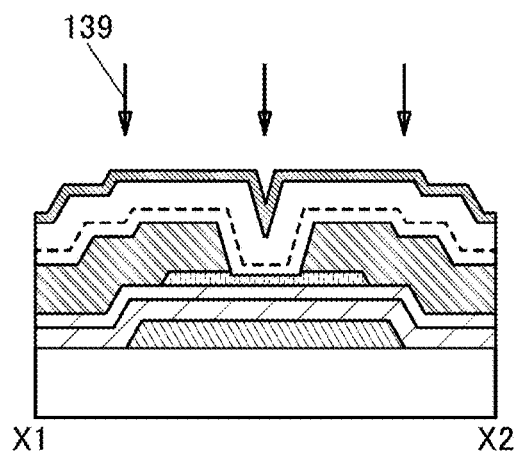
Figure 11C:
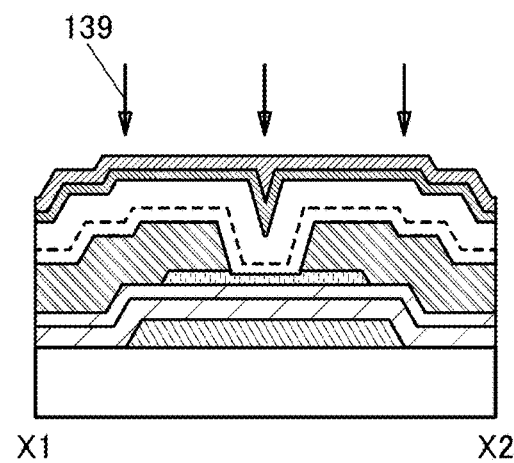

Next, a modification example of the method for manufacturing the transistor 100 in FIGS. 1A to 1C that is a semiconductor device of one embodiment of the present invention will be described with reference to FIGS. 11A to 11C. FIGS. 11A to 11C are cross-sectional views illustrating a method for manufacturing a semiconductor device.

First, the steps up to the step shown in FIG. 9B are performed. Then, a halogen element 139 is introduced into the insulating films 114 and 116 (see FIG. 11A).

Examples of the halogen element include fluorine and chlorine. The halogen element 139 may be introduced into the insulating films 114 and 116 from above the insulating film 116 by an ion doping method, an ion implantation method, or a plasma treatment method, using a gas containing fluorine or a gas containing chlorine.

Examples of the gas containing fluorine include carbon tetrafluoride ($CF_4$), sulfur hexafluoride ($SF_6$), nitrogen trifluoride ($NF_3$), trifluoromethane ($CHF_3$), silicon tetrafluoride ($SiF_4$), and perfluorocyclobutane ($C_4F_8$). Examples of the gas containing chlorine include chlorine ($Cl_2$), boron trichloride ($BCl_3$), silicon tetrachloride ($SiCl_4$), and carbon tetrachloride ($CCl_4$).

By application of a bias voltage to the substrate side when the halogen element 139 is introduced, the halogen element 139 can be effectively introduced into the insulating films 114 and 116. As the bias voltage, for example, an ashing apparatus is used, and power density applied to a substrate side of the ashing apparatus can be greater than or equal to 1 $W/cm^2$ and less than or equal to 5 $W/cm^2$. The substrate temperature during introduction of the halogen element 139 is higher than room temperature and lower than 350° C., preferably higher than or equal to 100° C. and lower than or equal to 250° C., whereby the halogen element can be introduced efficiently into the insulating films 114 and 116.

In this embodiment, an ashing apparatus is used. A $CF_4$ gas or a $SF_6$ gas is introduced into the ashing apparatus and a bias is applied to the substrate side, so that the halogen element 139 is introduced into the insulating films 114 and 116.

Note that by introducing the halogen element 139 from above the insulating film 116, the halogen element can be distributed such that the concentration of the halogen element is higher as it is closer to the upper surface of the insulating film 116.

<Halogen Element in Insulating Film>

Here, the concept of introducing the halogen element 139 into the insulating films 114 and 116 will be described with reference to FIGS. 18A to 18D.

Figure 18A:
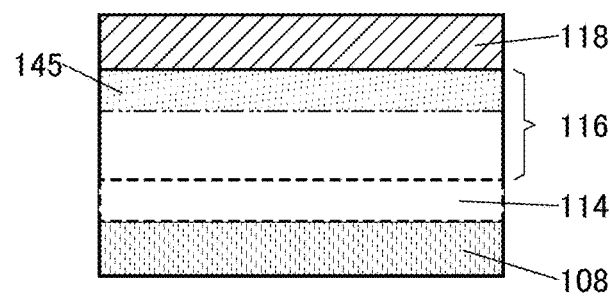
FIG. 18A is a cross-sectional view illustrating one embodiment of a semiconductor device and FIGS. 18B to 18D illustrate bonding states in silicon oxide.

FIG. 18A is a cross-sectional view illustrating an enlarged view of the semiconductor device.

The insulating film 116 shown in FIG. 18A includes a region 145. The region 145 is a region including a halogen element at high concentrations. In other words, the halogen element is contained at lower concentrations in the vicinity of the oxide semiconductor film 108. By introducing a halogen element from the upper surface side of the insulating film 116 for example, the halogen element can be introduced into the insulating film 116 such that the concentration of the halogen element is higher as it is closer to the upper surface of the insulating film 116. The oxide semiconductor film 108 might have an n-type conductivity because of the entry of a halogen element into the oxide semiconductor film 108; therefore, it is preferable to introduce a halogen element into the insulating film 116 that is positioned away from the oxide semiconductor film 108 as illustrated in FIG. 18A. On the other hand, a halogen element that enters the oxide semiconductor film 108 might be bonded to a constituent element of the oxide semiconductor film 108 and be brought into a stable state; accordingly, variations in reliability tests (e.g., positive gate bias temperature tests) might be reduced. In the case where fluorine is used as a halogen element and an In—Ga—Zn-based oxide is used as the oxide semiconductor film 108, for example, fluorine and In might be bonded to each other to be form a stable state.

<Silicon Oxide Containing Fluorine>

Figure 18B:
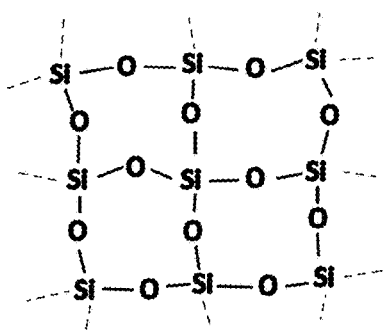
Figure 18C:
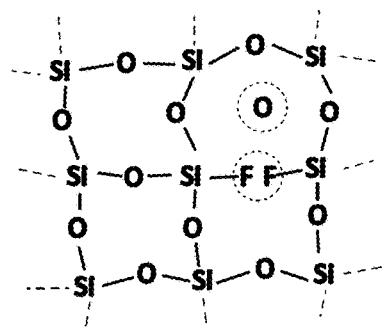
Figure 18D:
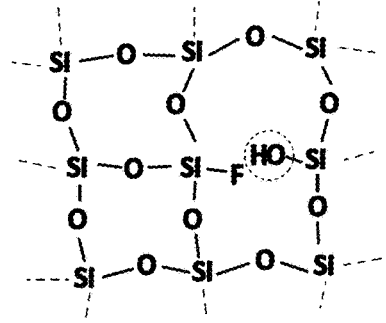

Next, the concept of introducing fluorine as a halogen element into silicon oxide used as the insulating film 116 in FIG. 18A will be described below with reference to FIGS. 18B to 18D.

Silicon oxide ($SiO_2$) including two oxygen atoms per silicon atom is assumed. One silicon atom is bonded to four oxygen atoms, and one oxygen atom is bonded to two silicon atoms (see FIG. 18B).

When two fluorine atoms enter the silicon oxide, bonds of one oxygen atom to two silicon atoms are cut ( . . . Si—O—Si . . . +2F→ . . . Si— —O— —Si . . . +2F). Then, the fluorine atoms are bonded to the silicon atoms whose bonds to the oxygen atom have been cut ( . . . Si—O—Si . . . +2F→ . . . Si—F  F—Si . . . +O). At this time, the oxygen atom whose bonds have been cut becomes excess oxygen (see FIG. 18C).

The excess oxygen contained in silicon oxide can reduce oxygen vacancies in the oxide semiconductor film. Oxygen vacancies in the oxide semiconductor film serve as hole traps or the like. Accordingly, excess oxygen contained in silicon oxide can lead to stable electrical characteristics of the transistor.

Furthermore, when one fluorine atom and one hydrogen atom enter silicon oxide, a bond of one of four oxygen atoms bonded to one silicon atom is cut ( . . . Si—O—Si . . . +F+H→ . . . Si— —O—Si . . . +F+H). Then, the fluorine atom is bonded to the silicon atom whose bond to the oxygen atom has been cut ( . . . Si— —O—Si . . . +F+H→ . . . Si—F —O—Si . . . +H). Then, the oxygen atom having been bonded to the silicon atom is bonded to the hydrogen atom and is terminated ( . . . Si—F —O—Si . . . +H→ . . . Si—F H—O—Si . . . ; see FIG. 18D).

When silicon oxide includes hydrogen traps, the hydrogen concentration of the oxide semiconductor film can be reduced. Note that hydrogen is an impurity in the oxide semiconductor film. For example, when hydrogen enters oxygen vacancy sites in an oxide semiconductor film, electrons serving as carriers might be generated. Thus, when silicon oxide includes hydrogen traps, the carrier density in the channel formation region can be lowered; as a result, the threshold voltage of the transistor can be shifted in the positive direction by the amount corresponding to the reduction of the carrier density. In other words, the transistor can have electrical characteristics close to normally-off characteristics. Hydrogen trapped in silicon oxide requires high energy to be eliminated. Accordingly, elimination of the trapped hydrogen is hard to occur in silicon oxide.

As described above, when fluorine is contained in silicon oxide, generation of excess oxygen and/or the trap of hydrogen occurs. Note that in the case where excess oxygen is consumed to reduce oxygen vacancies in the oxide semiconductor film, the amount of oxygen in the silicon oxide becomes smaller than that before fluorine enters the silicon oxide. In the case where hydrogen in the oxide semiconductor film is trapped, the amount of hydrogen in the silicon oxide becomes larger than that before fluorine enters the silicon oxide.

In order for the transistor to have stable electrical characteristics which are close to normally-off characteristics, excess oxygen and hydrogen traps are set at adequate amounts, which are attained for example by setting the fluorine concentration higher than the hydrogen concentration in the silicon oxide.

After the introduction of the halogen element 139, the steps shown in FIG. 9C and FIGS. 10A and 10B are performed, whereby a semiconductor device in which the insulating films 114 and 116 contain the halogen element can be manufactured.

Containing the halogen element in the insulating films 114 and 116 enables further increase of excess oxygen in the insulating films 114 and 116, which is preferable.

Although FIG. 11A illustrates an example in which the halogen element 139 is introduced from above the insulating film 116, one embodiment of the present invention is not limited thereto. The halogen element 139 may be introduced by a method shown in FIG. 11B or FIG. 11C.

FIG. 11B is a cross-sectional view of a manufacturing step in which the halogen element 139 is introduced after the metal oxide film 132 is formed as shown in FIG. 9C.

FIG. 11C is a cross-sectional view of a manufacturing step in which the halogen element 139 is introduced after the metal oxide film 134 is formed as shown in FIG. 10B.

As shown in FIGS. 11B and 11C, the halogen element 139 may be introduced into the insulating films 114 and 116 through the metal oxide films 132 and 134 if it is in a step after the insulating film 116 is formed. In the case where the manufacturing step shown in FIG. 11B is performed, the metal oxide film 132 also contains the halogen element 139.

In the case where the manufacturing step shown in FIG. 11C is performed, the metal oxide films 132 and 134 also contain the halogen element 139.

<Method 3 for Manufacturing Semiconductor Device>

Next, a method for manufacturing the transistor 150 in FIGS. 3A to 3C that is a semiconductor device of one embodiment of the present invention will be described with reference to FIGS. 12A to 12C and FIGS. 13A and 13B. FIGS. 12A to 12C and FIGS. 13A and 13B are cross-sectional views illustrating a method for manufacturing the semiconductor device.

Figure 12A:
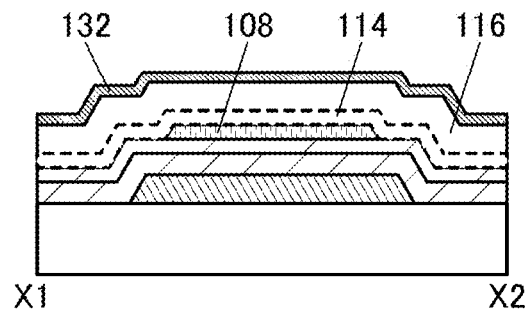
FIGS. 12A to 12C are cross-sectional views illustrating an example of a manufacturing process of a semiconductor device.

First, the steps up to the step shown in FIG. 8C are performed, and then the insulating films 114 and 116 and the metal oxide film 132 are formed over the insulating film 107 and the oxide semiconductor film 108 (see FIG. 12A).

Figure 12B:
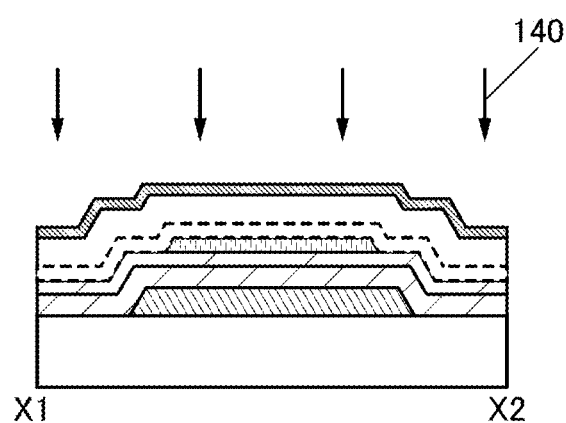

Then, oxygen 140 is introduced into the insulating films 114 and 116 through the metal oxide film 132 (see FIG. 12B).

Figure 12C:
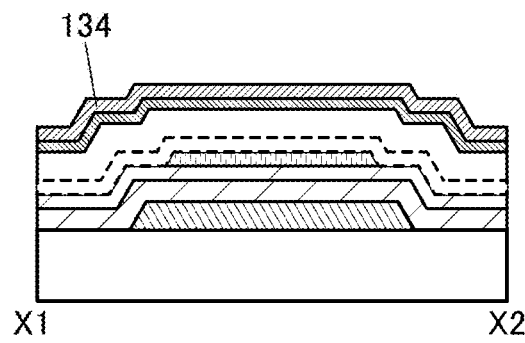

Then, the metal oxide film 134 is formed over the metal oxide film 132 (see FIG. 12C).

Next, a mask is formed over the metal oxide film 134 by a lithography process, and the openings 141a and 141b are formed in desired regions in the insulating films 114 and 116 and the metal oxide films 132 and 134. Note that the openings 141a and 141b reach the oxide semiconductor film 108 (see FIG. 13A).

Figure 13A:
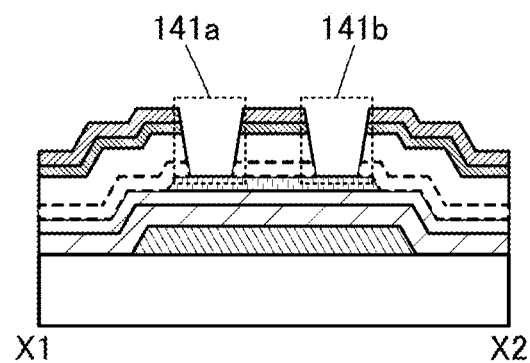
FIGS. 13A and 13B are cross-sectional views illustrating an example of a manufacturing process of a semiconductor device.
Figure 13B:
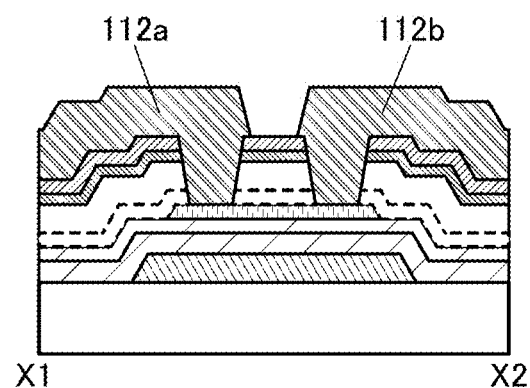

Then, a conductive film is formed over the oxide semiconductor film 108 and the metal oxide film 134 to cover the openings 141a and 141b, a mask is formed over the conductive film through a lithography process, and the conductive film is processed into desired shapes, whereby the conductive films 112a and 112b are formed (see FIG. 13B).

Through the above process, the transistor 150 illustrated in FIGS. 3A to 3C can be manufactured.

Figure 4B:
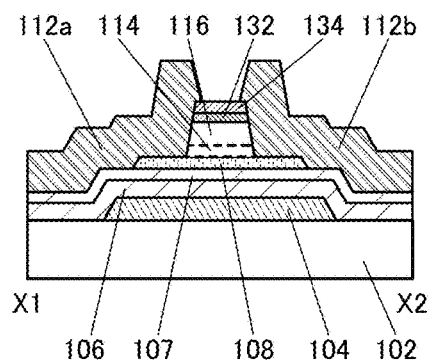
Figure 4C:
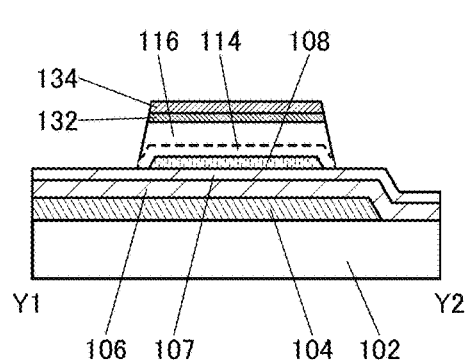

Note that the transistor 160 in FIGS. 4A to 4C can be manufactured in such a manner that the insulating films 114 and 116 are left over a channel region of the oxide semiconductor film 108 at the formation of the openings 141a and 141b.

<Method 4 for Manufacturing Semiconductor Device>

Next, a method for manufacturing the transistor 170 that is a semiconductor device of one embodiment of the present invention will be described with reference to FIGS. 14A to 14D and FIGS. 15A to 15D. FIGS. 14A and 14C and FIGS. 15A and 15C are each a cross-sectional view in the channel length direction of the transistor 170 in the manufacturing process, and FIGS. 14B and 14D and FIGS. 15B and 15D are each a cross-sectional view in the channel width direction of the transistor 170 in the manufacturing process.

Figure 14A:
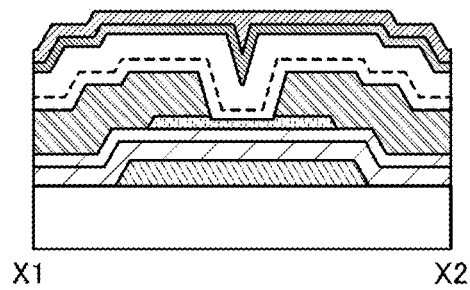
FIGS. 14A to 14D are cross-sectional views illustrating an example of a manufacturing process of a semiconductor device.
Figure 14B:
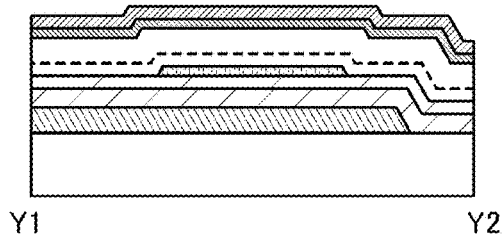
Figure 14C:
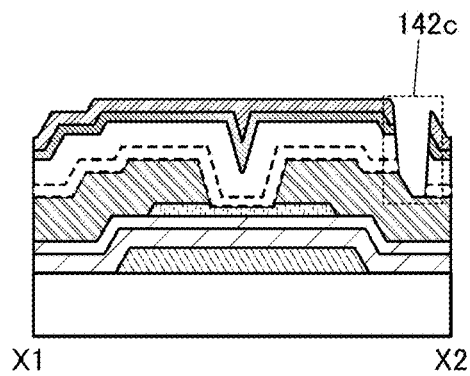
Figure 14D:
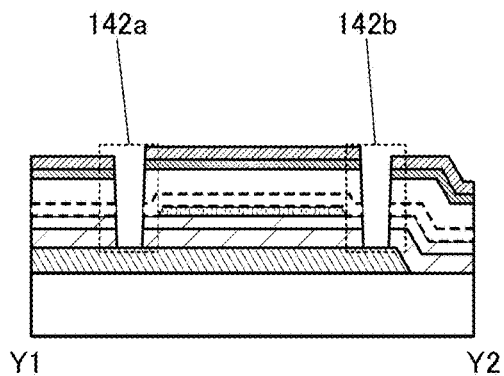

First, the steps up to the step in FIG. 10B are performed (see FIGS. 14A and 14B).

Next, a mask is formed over the metal oxide film 134 through a lithography process, and the opening 142c is formed in a desired region in the insulating films 114 and 116 and the metal oxide films 132 and 134. In addition, a mask is formed over the metal oxide film 134 through a lithography process, and the openings 142a and 142b are formed in desired regions in the insulating films 106, 107, 114, and 116, and the metal oxide films 132 and 134. Note that the opening 142c reaches the conductive film 112b. The openings 142a and 142b reach the conductive film 104 (see FIGS. 14C and 14D).

Note that the openings 142a and 142b and the opening 142c may be formed in the same step or may be formed by different steps. In the case where the openings 142a and 142b and the opening 142c are formed in the same step, for example, a gray-tone mask or a half-tone mask can be used.

Figure 15A:
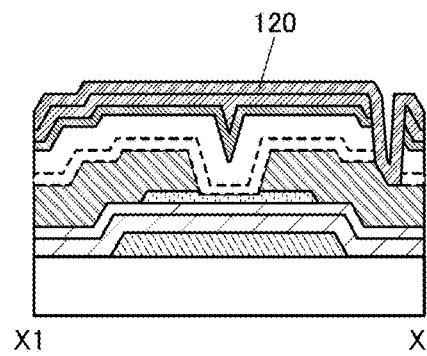
FIGS. 15A to 15D are cross-sectional views illustrating an example of a manufacturing process of a semiconductor device.
Figure 15B:
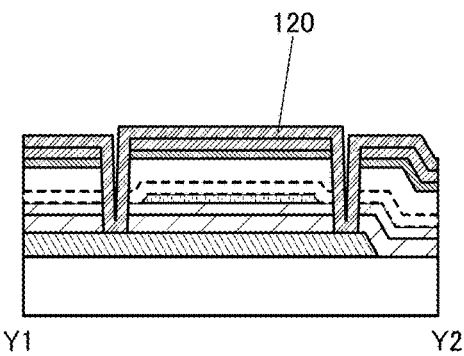

Next, a conductive film 120 is formed over the metal oxide film 134 to cover the openings 142*a*, 142*b*, and 142*c* (see FIGS. 15A and 15B).

For the conductive film 120, for example, a material containing one of indium (In), zinc (Zn), and tin (Sn) can be used. In particular, for the conductive film 120, a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide containing silicon oxide can be used. Moreover, the conductive film 120 is favorably formed using the same kind of material as the metal oxide film 132, in which case the manufacturing cost can be reduced.

The conductive film 120 can be formed by a sputtering method, for example. In this embodiment, a 110-nm-thick ITSO film is formed by a sputtering method.

Figure 15C:
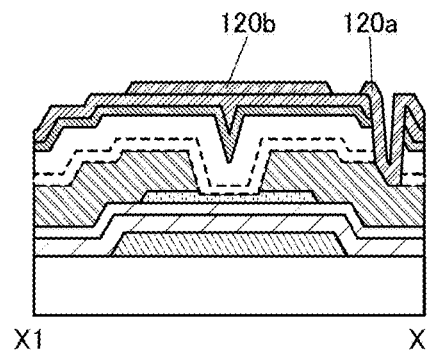
Figure 15D:
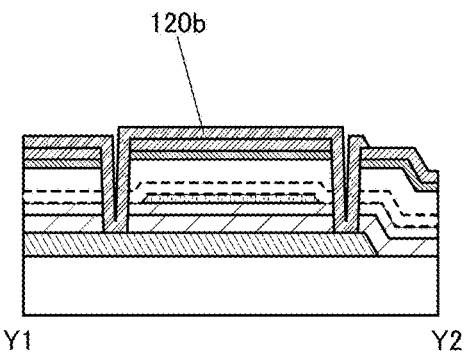

Next, a mask is formed over the conductive film 120 through a lithography process, and the conductive film 120 is processed into desired shapes to form the conductive films 120*a* and 120*b* (see FIGS. 15C and 15D).

Through the above process, the transistor 170 illustrated in FIGS. 5A to 5C can be manufactured.

In Embodiment 1, one embodiment of the present invention has been described. Note that one embodiment of the present invention is not limited to the above examples. In other words, various embodiments of the invention are described in this embodiment and the other embodiments, and one embodiment of the present invention is not limited to a particular embodiment. For example, an example in which an oxide semiconductor film is included in a channel region is described in this embodiment; however, one embodiment of the present invention is not limited to this example. Depending on cases or conditions, silicon, germanium, silicon germanium, silicon carbide, gallium arsenide, aluminum gallium arsenide, indium phosphide, gallium nitride, an organic semiconductor, or the like may be used in one embodiment of the present invention.

The structure and method described in this embodiment can be implemented by being combined as appropriate with any of the other structures and methods described in the other embodiments.

Embodiment 2

In this embodiment, the structure of an oxide semiconductor film included in a semiconductor device of one embodiment of the present invention will be described in detail. First, structures that can be included in an oxide semiconductor film will be described below.

An oxide semiconductor is classified into a single crystal oxide semiconductor and a non-single-crystal oxide semiconductor.

Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has an unstable structure as described below. For this reason, an a-like OS has physical properties similar to those of an amorphous oxide semiconductor.

Even when an amorphous oxide semiconductor having an unstable structure as one of definitions can be used for a channel formation region of a transistor, the transistor may be insufficient for practical use as a product. The same matter applies to an a-like OS. Thus, it is preferable that components of an amorphous oxide semiconductor and an a-like OS be rarely included or be not included at all in products.

<CAAC-OS>

A CAAC-OS is one of oxide semiconductors having a plurality of c-axis aligned crystal parts (also referred to as pellets). Note that a CAAC-OS can be referred to as an oxide semiconductor including c-axis aligned nanocrystals (CANC).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 19A:
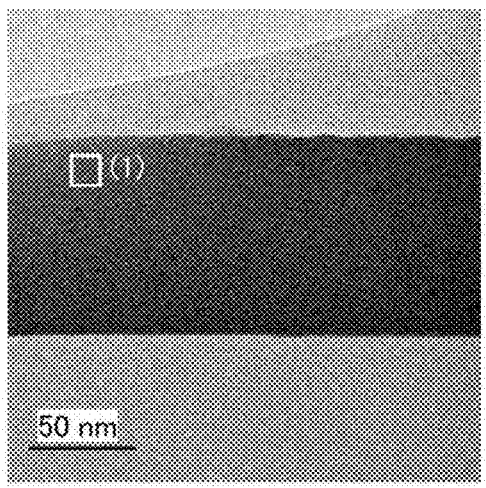
FIGS. 19A to 19D are Cs-corrected high-resolution TEM images of a cross section of a CAAC-OS and a cross-sectional schematic view of a CAAC-OS.

FIG. 19A shows an example of a high-resolution TEM image of a cross section of the CAAC-OS which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

The CAAC-OS observed with a TEM will be described below. FIG. 19A shows an example of a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 19B:
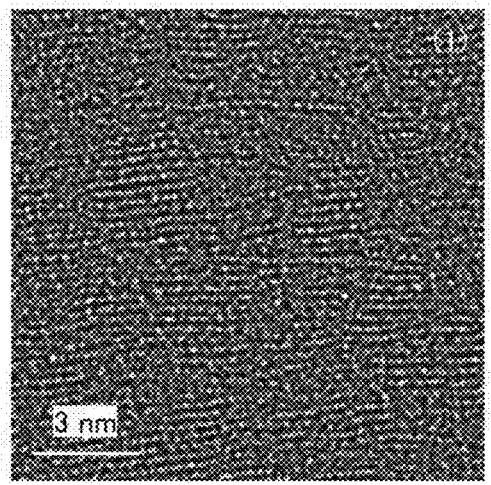

FIG. 19B is an enlarged Cs-corrected high-resolution TEM image of a region (1) in FIG. 19A. FIG. 19B shows that metal atoms are arranged in a layered manner in a pellet.

Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 19C:
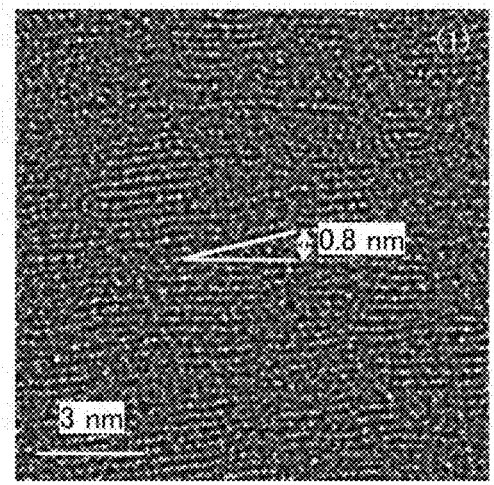

As shown in FIG. 19B, the CAAC-OS has a characteristic atomic arrangement. The characteristic atomic arrangement is denoted by an auxiliary line in FIG. 19C. FIGS. 19B and 19C prove that the size of a pellet is approximately 1 nm to 3 nm, and the size of a space caused by tilt of the pellets is approximately 0.8 nm. Therefore, the pellet can also be referred to as a nanocrystal (nc).

Figure 19D:
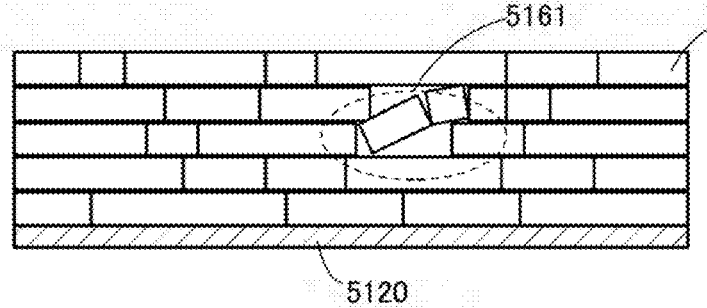

Here, according to the Cs-corrected high-resolution TEM images, the schematic arrangement of pellets 5100 of a CAAC-OS over a substrate 5120 is illustrated by such a structure in which bricks or blocks are stacked (see FIG. 19D). The part in which the pellets are tilted as observed in FIG. 19C corresponds to a region 5161 shown in FIG. 19D.

FIG. 20A shows a Cs-corrected high-resolution TEM image of a plane of the CAAC-OS observed from a direction substantially perpendicular to the sample surface. FIGS. 20B, 20C, and 20D are enlarged Cs-corrected high-resolution TEM images of regions (1), (2), and (3) in FIG. 20A, respectively. FIGS. 20B, 20C, and 20D indicate that metal atoms are arranged in a triangular, quadrangular, or hexagonal configuration in a pellet. However, there is no regularity of arrangement of metal atoms between different pellets.

Figure 21A:
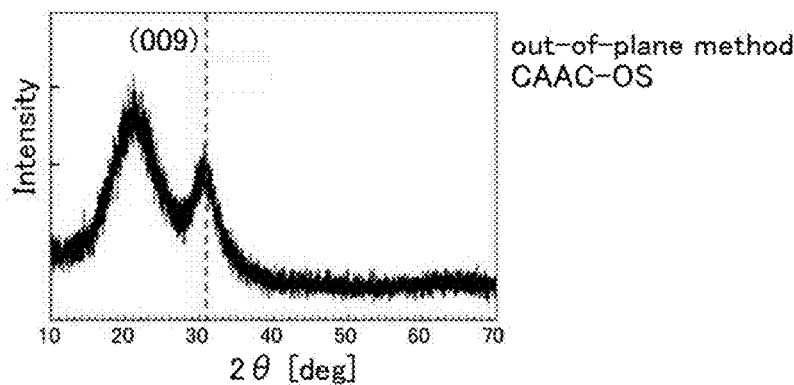
FIGS. 21A to 21C show structural analyses of a CAAC-OS and a single crystal oxide semiconductor by XRD.

Next, a CAAC-OS analyzed by X-ray diffraction (XRD) will be described. For example, when the structure of a CAAC-OS including an $InGaZnO_4$ crystal is analyzed by an out-of-plane method, a peak appears at a diffraction angle (2θ) of around 31° as shown in FIG. 21A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 21B:
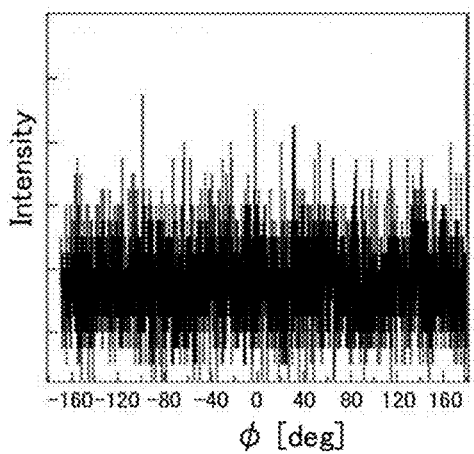
Figure 21C:
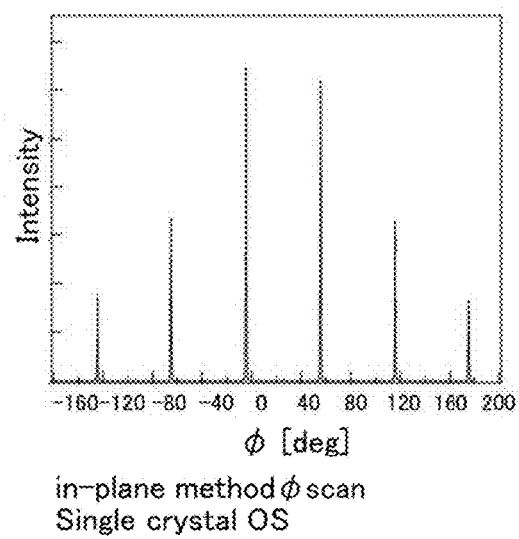

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. For the CAAC-OS, when analysis (φ scan) is performed with 2θ fixed at around 56° and with the sample rotated using a normal vector of the sample surface as an axis (φ axis), as shown in FIG. 21B, a peak is not clearly observed. In contrast, for a single crystal oxide semiconductor of $InGaZnO_4$, when φ scan is performed with 2θ fixed at around 56°, as shown in FIG. 21C, six peaks which are derived from crystal planes equivalent to the (110) plane are observed. Accordingly, the structural analysis using XRD shows that the directions of a-axes and b-axes are irregularly oriented in the CAAC-OS.

Figure 22A:
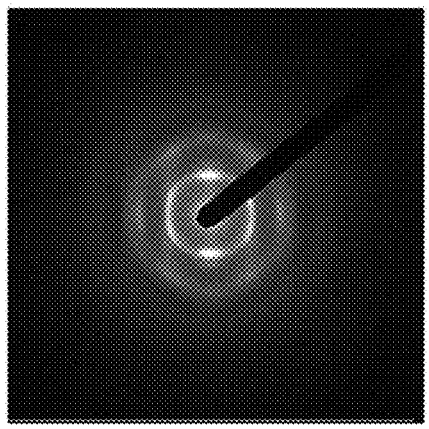
FIGS. 22A and 22B show electron diffraction patterns of a CAAC-OS.
Figure 22B:
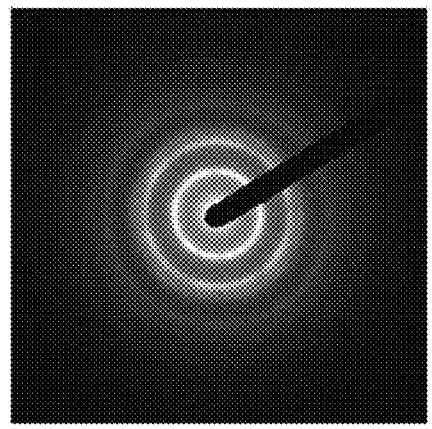

Next, a CAAC-OS analyzed by electron diffraction will be described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 22A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 22B shows a diffraction pattern obtained in such a manner that an electron beam with a probe diameter of 300 nm is incident on the same sample in a direction perpendicular to the sample surface. As shown in FIG. 22B, a ring-like diffraction pattern is observed. Thus, the electron diffraction also indicates that the a-axes and b-axes of the pellets included in the CAAC-OS do not have regular alignment. The first ring in FIG. 22B is considered to be derived from the (010) plane, the (100) plane, and the like of the $InGaZnO_4$ crystal. The second ring in FIG. 22B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element contained in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductors. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<nc-OS>

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 100 nm, or greater than or equal to 1 nm and less than or equal to 10 nm. An oxide semiconductor including a nanocrystal that is a microcrystal with a size greater than or equal to 1 nm and less than or equal to 10 nm, or a size greater than or equal to 1 nm and less than or equal to 3 nm is specifically referred to as an nc-OS. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor having more regularity than an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

The amorphous oxide semiconductor is such an oxide semiconductor having disordered atomic arrangement and no crystal part. An example of the amorphous oxide semiconductor is an oxide semiconductor with a non-crystalline state like quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which does not have long-range ordering but might have ordering within the range from an atom to the nearest neighbor atom or the second-nearest neighbor atom is called an amorphous structure in some cases. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.

<a-Like OS>

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation will be described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that a crystal part is determined as follows. It is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 23:
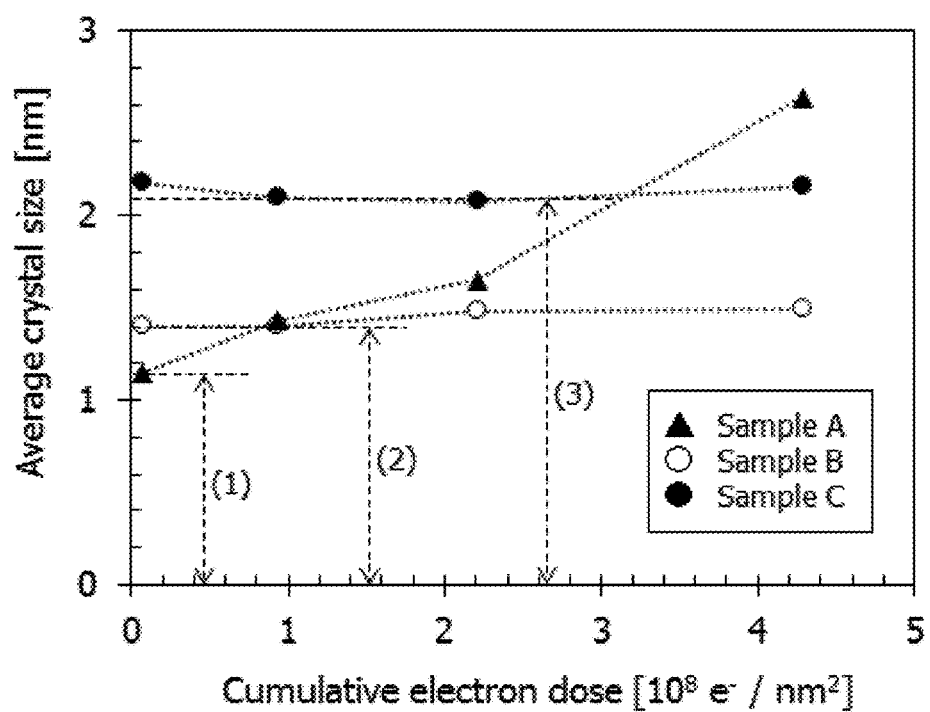
FIG. 23 shows changes of crystal parts of In—Ga—Zn oxides induced by electron irradiation.

FIG. 23 shows the change in the average size of crystal parts (at 22 points to 45 points) in each sample. Note that the crystal part size corresponds to the length of a lattice fringe. FIG. 23 indicates that the crystal part size in the a-like OS increases with an increase in the cumulative electron dose. Specifically, as shown by (1) in FIG. 23, a crystal part of approximately 1.2 nm at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 23, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor layer having a density of lower than 78% of the density of the single crystal oxide semiconductor layer.

For example, for an oxide semiconductor having an atomic ratio of In:Ga:Zn=1:1:1, the density of single crystal InGaZnO$_4$ with a rhombohedral crystal structure is 6.357 g/cm$^3$. Accordingly, for the oxide semiconductor having an atomic ratio of In:Ga:Zn=1:1:1, the density of the a-like OS is higher than or equal to 5.0 g/cm$^3$ and lower than 5.9 g/cm$^3$. For example, for the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductor layers with different compositions are combined at a desired ratio, which makes it possible to calculate density equivalent to that of a single crystal oxide semiconductor layer with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, a microcrystalline oxide semiconductor, and a CAAC-OS, for example.

The semiconductor device of one embodiment of the present invention can be formed using an oxide semiconductor film having any of the above structures.

<Formation Method of CAAC-OS Film>

An example of a method for forming a CAAC-OS film will be described below.

Figure 24:
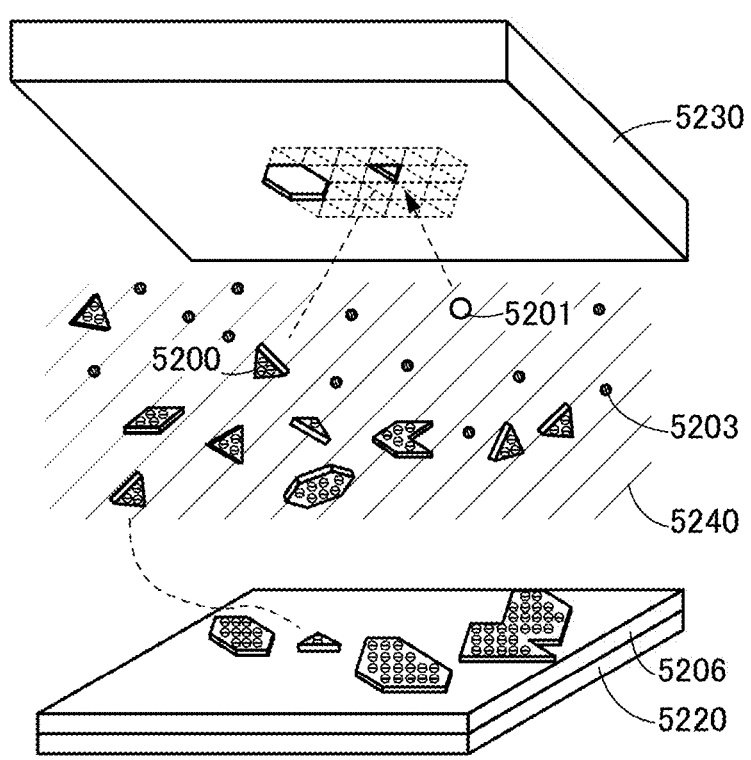
FIG. 24 is a schematic view illustrating the inside of a deposition chamber.

FIG. 24 is a schematic view illustrating the inside of a deposition chamber. The CAAC-OS film can be formed by a sputtering method.

As shown in FIG. 24, a substrate 5220 and a target 5230 are arranged to face each other. Plasma 5240 is generated between the substrate 5220 and the target 5230. The plasma 5240 includes an ion 5201 generated by ionization of a composition of a sputtering gas.

The ion 5201 is accelerated to move toward the target 5230, and when the ion 5201 collides with the target 5230, a pellet 5200 that is a pellet-like particle is separated from the target 5230. At that time, a particle 5203 formed from an atom contained in the target 5230 is concurrently separated. Then, the pellet 5200 and the particle 5203 receive electric charge in the plasma 5240 and thus are charged.

An oxide thin film 5206 has been already deposited over the substrate 5220. After reaching a surface of the oxide thin film 5206, the pellet 5200 and the particle 5203 are deposited to avoid another pellet 5200. This deposition is caused by repelling force (repulsive force) generated on the surfaces of the pellets 5200 that are electrically charged with the same polarity (negative in this case). Note that the substrate 5220 is heated, and the pellet 5200 and the particle 5203 that are deposited migrate over the surface of the substrate 5220.

Figure 25A:
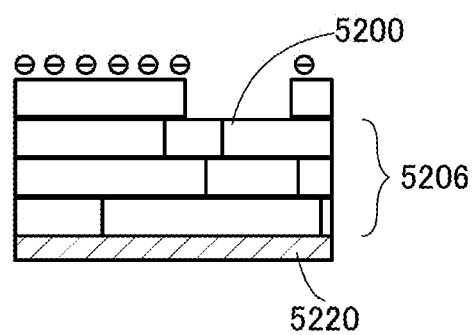
FIGS. 25A to 25C illustrate a cross-sectional form of a pellet and a top-view form of a pellet.

The oxide thin film 5206 and the pellet 5200 over the substrate 5220 have cross-sectional shapes shown in FIG. 25A.

Note that the pellet 5200 has a shape obtained by cleavage of the target 5230. An In-M-Zn oxide (M represents Ti, Ga, Y, Zr, La, Ce, Nd, Sn, or Hf), for example, has a cross-sectional shape shown in FIG. 25B and a top-view shape shown in FIG. 25C.

<Deposition Models of CAAC-OS and nc-OS>

A deposition model of the CAAC-OS will be described in detail below.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5230, and the plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation (O$^+$) and an argon cation (Ar$^+$). A heating mechanism may be provided under the substrate 5220 although not shown in the drawing.

The target 5230 is attached to a backing plate although not shown in the drawing. A plurality of magnets is arranged to face the target 5230 with the backing plate positioned therebetween. A sputtering method in which the disposition speed is increased by utilizing a magnetic field of magnets is referred to as a magnetron sputtering method.

Here, the target 5230 has a polycrystalline structure which includes a plurality of crystal grains and in which a cleavage plane exists in any of the crystal grains.

Figure 25B:
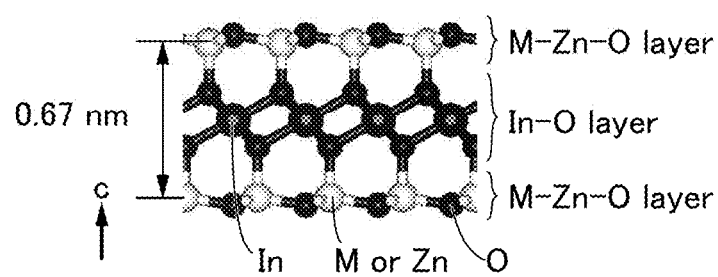
Figure 25C:
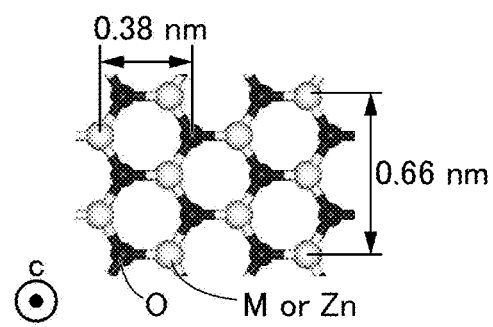

The ion 5201 generated in the high-density plasma region is accelerated toward the target 5230 side by an electric field, and then collides with the target 5230. At this time, the pellet 5200, which is a flat-plate-like or pellet-like sputtered particle, is separated from the cleavage plane. The cross section and the top-view of the pellet 5200 is as shown in FIG. 25B and FIG. 25C, respectively. Note that the structure of the pellet 5200 may be distorted by an impact of collision of the ion 5201.

The pellet 5200 is a flat-plate-like (pellet-like) sputtered particle having a triangle plane, e.g., regular triangle plane. Alternatively, the pellet 5200 is a flat-plate-like (pellet-like) sputtered particle having a hexagon plane, e.g., regular hexagon plane. However, the shape of a flat plane of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined in accordance with the kind of the deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 3 nm, preferably greater than or equal to 1.2 nm and less than or equal to 2.5 nm.

The surface of the pellet 5200 may be negatively or positively charged when the pellet 5200 passes through the plasma 5240. That is because, for example, the pellet 5200 receives a negative charge from $O^{2-}$ in the plasma 5240. As a result, oxygen atoms on the surface of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particle 5203 that have passed through the plasma 5240 reach a surface of the substrate 5220. Note that some of the particles 5203 are discharged to the outside by a vacuum pump or the like because of their smallness in mass.

After the gaps between the pellets 5200 are filled with the particles 5203, a layer with a thickness approximately the same as that of the pellet 5200 is formed. That is, the CAAC-OS includes nanocrystalline pellets 5200 in the initial stage. For the deposition model of the CAAC-OS, a plurality of nanocrystalline pellets 5200 are bonded to each other in the lateral direction over the substrate 5220, whereby a first layer is formed. Then, other pellets 5200 are deposited over the first layer, whereby a second layer is formed. With repetition of this cycle, a structure including a plurality of stacked layers is formed.

A deposition way of the pellets 5200 changes according to the surface temperature of the substrate 5220 or the like. For example, if the surface temperature of the substrate 5220 is high, migration of the pellets 5200 occurs over the substrate 5220. As a result, a proportion of the pellets 5200 that are directly connected with each other without the particles 5203 increases, whereby a CAAC-OS with high orientation is made. The surface temperature of the substrate 5220 for formation of the CAAC-OS is higher than or equal to 100° C. and lower than 500° C., preferably higher than or equal to 140° C. and lower than 450° C., or further preferably higher than or equal to 170° C. and lower than 400° C. Therefore, even when a large-sized substrate of the 8th generation or more is used as the substrate 5220, a warp or the like hardly occur.

Figure 26:
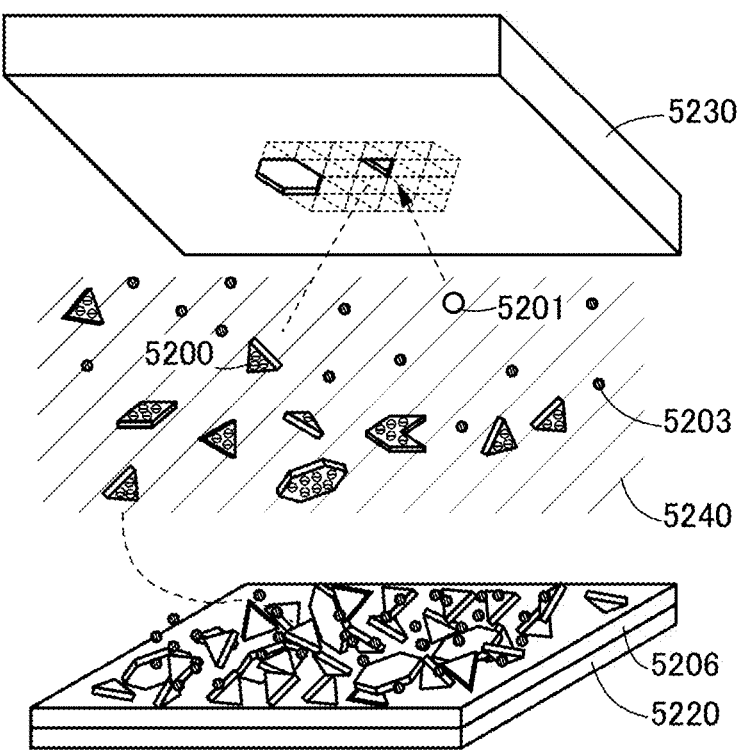
FIG. 26 is a schematic view illustrating the inside of a deposition chamber.

On the other hand, if the surface temperature of the substrate 5220 is low, the migration of the pellets 5200 over the substrate 5220 does not easily occur. As a result, the pellets 5200 are stacked to form an nc-OS or the like with low orientation (see FIG. 26). In the nc-OS, the pellets 5200 are possibly deposited equidistantly from one another since the pellets 5200 are negatively charged. Therefore, the nc-OS film has low orientation but some regularity, and thus it has a denser structure than an amorphous oxide semiconductor.

When spaces between pellets are extremely small, the pellets may form a large pellet. The inside of the large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above.

The pellets 5200 are considered to be deposited on the substrate 5220 according to the deposition model described above. Thus, a CAAC-OS can be deposited even when a formation surface does not have a crystal structure; therefore, a growth mechanism in this case is different from epitaxial growth. In addition, a uniform film of a CAAC-OS or an nc-OS can be formed even over a large-sized glass substrate or the like. For example, even when the surface of the substrate 5220 (formation surface) has an amorphous structure (e.g., such as amorphous silicon oxide), a CAAC-OS can be formed.

In addition, even when the surface of the substrate 5220 (formation surface) has an uneven shape, the pellets 5200 are aligned along the shape.

According to the deposition model described above, a CAAC-OS with high crystallinity can be formed even on a film formation surface with an amorphous structure.

The structure and method described in this embodiment can be implemented by being combined as appropriate with any of the other structures and methods described in the other embodiments.

Embodiment 3

In this embodiment, a display device that includes a semiconductor device of one embodiment of the present invention is described with reference to FIGS. 27A to 27C.
<Display Device>

The display device illustrated in FIG. 27A includes a region including pixels of display elements (hereinafter the region is referred to as a pixel portion 502), a circuit portion provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

A part or the whole of the driver circuit portion 504 is preferably formed over a substrate over which the pixel portion 502 is formed, in which case the number of components and the number of terminals can be reduced. When a part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter, such wirings are referred to as scan lines GL_1 to GL_X).

Note that a plurality of gate drivers 504a may be provided to control the scan lines GL_1 to GL_X separately. Alternatively, the gate driver 504a has a function of supplying an initialization signal. Without being limited thereto, the gate driver 504a can supply another signal.

The source driver 504b includes a shift register or the like. The source driver 504b receives a signal (video signal) from which a data signal is derived, as well as a signal for driving the shift register, through the terminal portion 507. The source driver 504b has a function of generating a data signal to be written to the pixel circuit 501 which is based on the video signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter such wirings are referred to as data lines DL_1 to DL_). Alternatively, the source driver 504b has a function of supplying an initialization signal. Without being limited thereto, the source driver 504b can supply another signal.

The source driver 504b includes a plurality of analog switches or the like, for example. The source driver 504b can output, as the data signals, signals obtained by time-dividing the video signal by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504a. For example, to the pixel circuit 501 in the m-th row and the n-th column (m is a natural number of less than or equal to X, and n is a natural number of less than or equal Y), a pulse signal is input from the gate driver 504a through the scan line GL_m, and a data signal is input from the source driver 504b through the data line DL_n in accordance with the potential of the scan line GL_m.

Figure 27A:
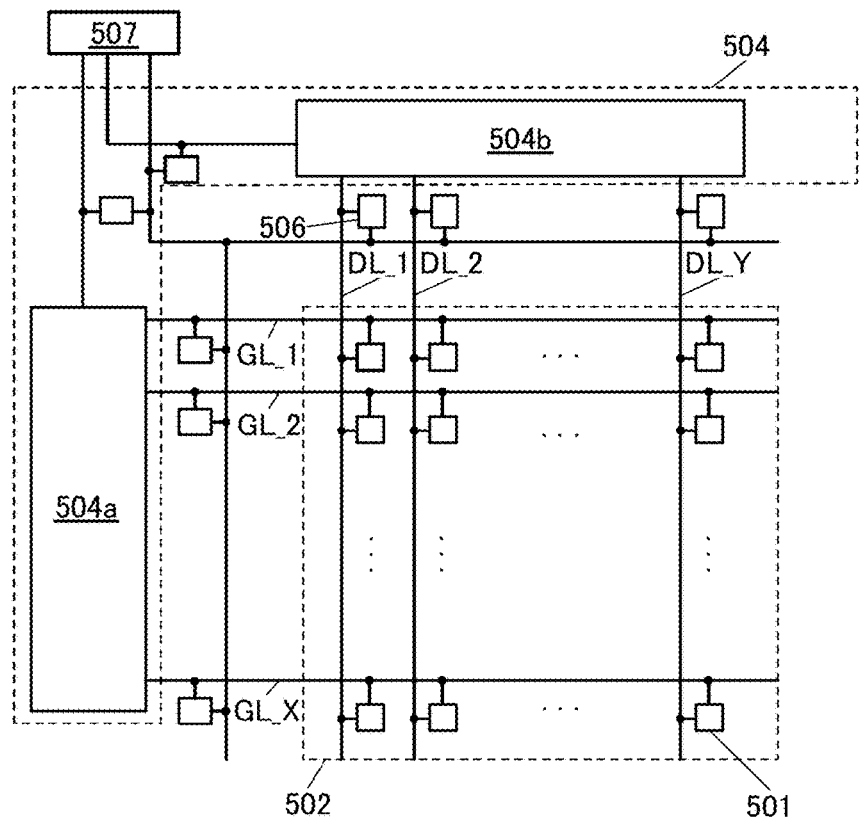
FIGS. 27A to 27C are a block diagram and circuit diagrams illustrating a display device.

The protection circuit 506 shown in FIG. 27A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 27A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 27A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 27B:
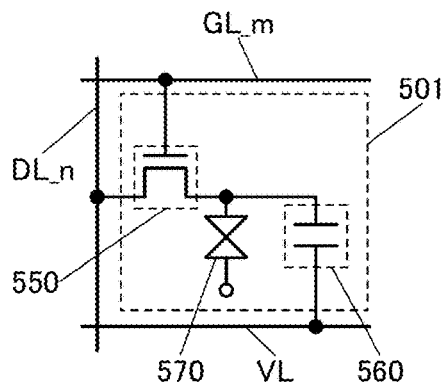

Each of the plurality of pixel circuits 501 in FIG. 27A can have the structure illustrated in FIG. 27B, for example.

The pixel circuit 501 illustrated in FIG. 27B includes a liquid crystal element 570, a transistor 550, and a capacitor 560. As the transistor 550, any of the transistors described in the above embodiments can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As a driving method of the display device including the liquid crystal element 570, any of the following modes can be used, for example: a twisted nematic (TN) mode, a super-twisted nematic (STN) mode, a vertical alignment (VA) mode, a multi-domain vertical alignment (MVA) mode, a patterned vertical alignment (PVA) mode, an in-plane-switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an FFS mode, a transverse bend alignment (TBA) mode, and the like.

Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 27B, the pixel circuits 501 are sequentially selected row by row by the gate driver 504a illustrated in FIG. 27A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 27C:
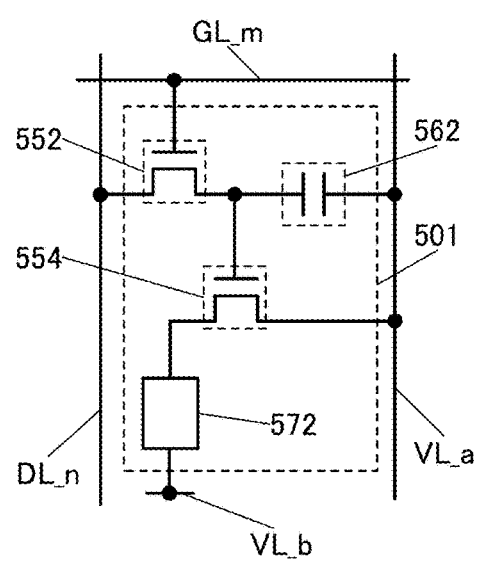

Alternatively, each of the plurality of pixel circuits 501 in FIG. 27A can have the structure illustrated in FIG. 27C, for example.

The pixel circuit 501 illustrated in FIG. 27C includes transistors 552 and 554, a capacitor 562, and a light-emitting element 572. Any of the transistors described in the above embodiments can be used as one or both of the transistors 552 and 554.

One of a source electrode and a drain electrode of the transistor 552 is electrically connected to a wiring to which a data signal is supplied (hereinafter referred to as a data line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) or the like can be used, for example. Note that the light-emitting element 572 is not limited to an organic EL element; an inorganic EL element including an inorganic material may be used.

A high power supply potential VDD is supplied to one of the potential supply line VL_a and the potential supply line VL_b, and a low power supply potential VSS is supplied to the other.

For example, in the display device including the pixel circuit 501 in FIG. 27C, the pixel circuits 501 are sequentially selected row by row by the gate driver 504a illustrated in FIG. 27A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Although the structures including the liquid crystal element 570 or the light-emitting element 572 as a display element of the display device are described in this embodiment, one embodiment of the present invention is not limited to these structures and a variety of elements may be included in the display device.

For example, the display device includes at least one of a liquid crystal element, an EL element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element using a carbon nanotube, and the like. Alternatively, the display device may include a display medium whose contrast, luminance, reflectivity, transmittance, or the like is changed by electrical or magnetic effect. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

A progressive type display, an interlace type display, or the like can be employed as the display type of the display device of this embodiment. Further, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color elements. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors R, G, B, Y, and W. By using self-luminous elements, power consumption can be further reduced as compared to the case of using the coloring layer in some cases.

The structures described in this embodiment can be used in appropriate combination with any of the structures described in the other embodiments.

Embodiment 4

In this embodiment, a display device including a semiconductor device of one embodiment of the present invention and an electronic device in which the display device is provided with an input device will be described with reference to FIGS. 28A and 28B, FIGS. 29A and 29B, FIG. 30, FIGS. 31A and 31B, FIGS. 32A and 32B, and FIG. 33.

<Touch Panel>

In this embodiment, a touch panel 2000 including a display device and an input device will be described as an example of an electronic device. In addition, an example in which a touch sensor is used as an input device will be described.

Figure 28A:
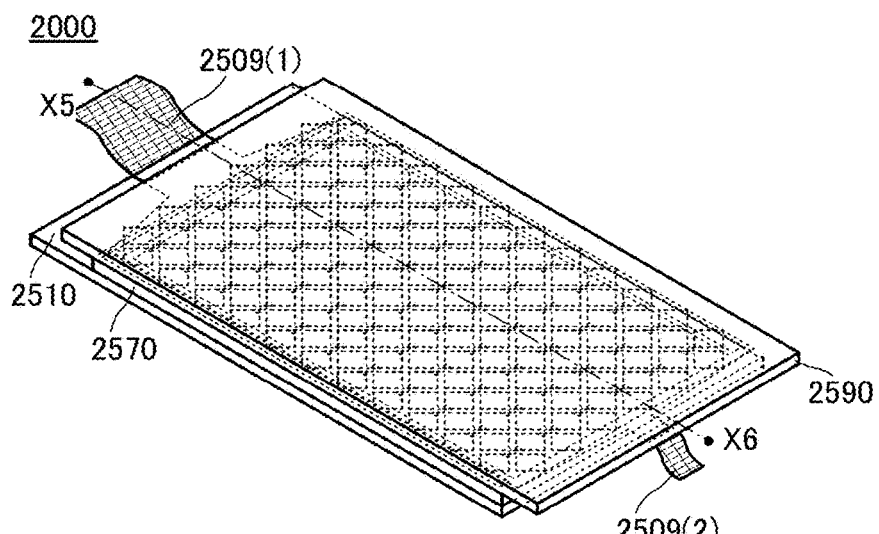
FIGS. 28A and 28B are perspective views illustrating an example of a touch panel.
Figure 28B:
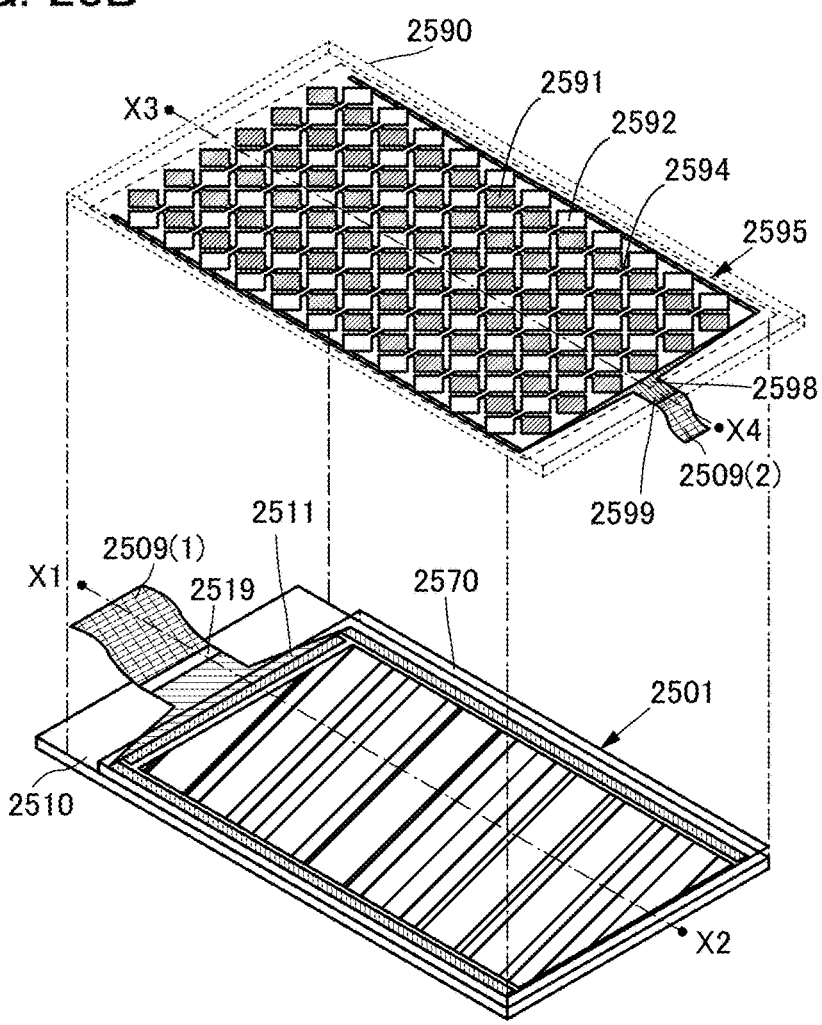

FIGS. 28A and 28B are perspective views of the touch panel 2000. Note that FIGS. 28A and 28B illustrate only main components of the touch panel 2000 for simplicity.

The touch panel 2000 includes a display device 2501 and a touch sensor 2595 (see FIG. 28B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 28B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 28B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 28A and 28B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films such as the electrodes 2591, the electrodes 2592, and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (for example, a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 $\Omega/\text{cm}^2$ or more and 100 $\Omega/\text{cm}^2$ or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<Display Device>

Figure 29A:
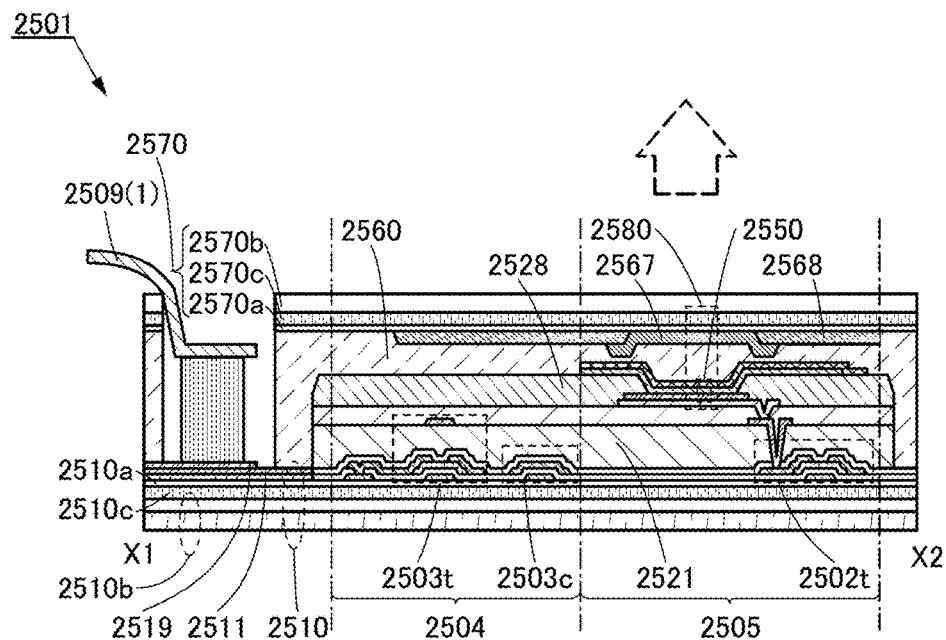
FIGS. 29A and 29B are cross-sectional views illustrating examples of a display device.
Figure 29B:
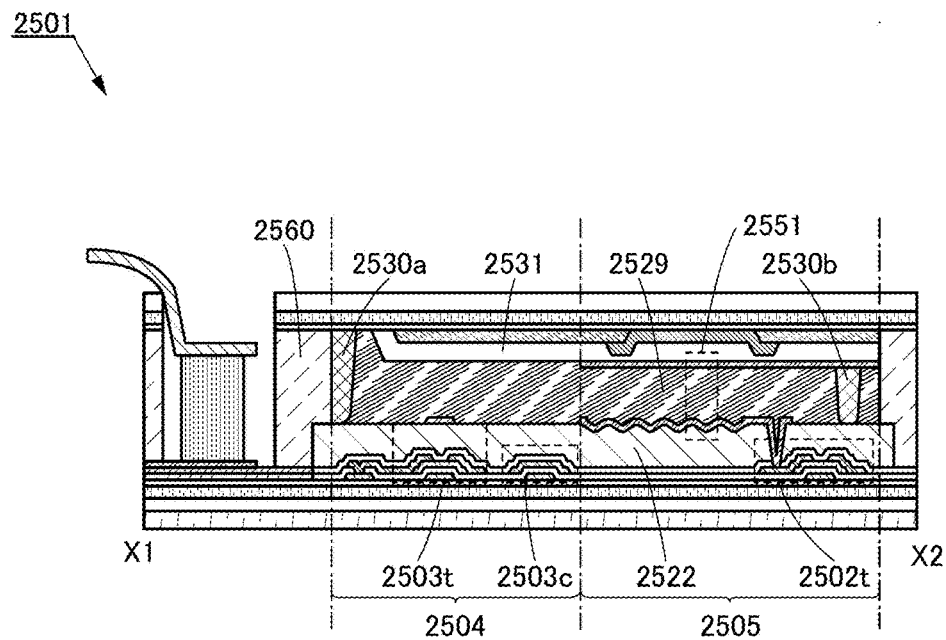

Next, the display device 2501 will be described in detail with reference to FIGS. 29A and 29B. FIGS. 29A and 29B correspond to cross-sectional views taken along dashed-dotted line X1-X2 in FIG. 28B.

The display device 2501 includes a plurality of pixels arranged in a matrix. Each of the pixels includes a display element and a pixel circuit for driving the display element.
<Structure with EL Element as Display Element>

First, a structure that uses an EL element as a display element will be described below with reference to FIG. 29A. In the following description, an example of using an EL element that emits white light will be described; however, the EL element is not limited to this element. For example, EL elements that emit light of different colors may be included so that the light of different colors can be emitted from adjacent pixels.

For the substrate 2510 and the substrate 2570, for example, a flexible material with a vapor permeability of lower than or equal to $10^{-5}$ g/(m²·day), preferably lower than or equal to $10^{-6}$ g/(m²·day) can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layer 2510c and the adhesive layer 2570c, for example, materials that include polyester, polyolefin, polyamide (e.g., nylon, aramid), polyimide, polycarbonate, polyurethane, an acrylic resin, an epoxy resin, or a resin having a siloxane bond can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 29A, the sealing layer 2560 can also serve as an optical element.

A sealant may be formed in the peripheral portion of the sealing layer 2560. With the use of the sealant, an EL element 2550 can be provided in a region surrounded by the substrate 2510, the substrate 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which is impermeable to moisture or oxygen is preferably used.

The display device 2501 illustrated in FIG. 29A includes a pixel 2505. The pixel 2505 includes a light-emitting module 2580, the EL element 2550 and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 29A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition 2528 is provided so as to overlap with an end portion of the lower electrode of the EL element 2550. Note that a spacer for controlling the distance between the substrate 2510 and the substrate 2570 may be formed over the partition 2528.

A scan line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor film which is highly purified and in which formation of oxygen vacancies is suppressed. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of suppressing power consumption. In addition, the transistors used in this embodiment can have relatively high field-effect mobility and thus are capable of high speed operation. For example, with such transistors which can operate at high speed used for the display device 2501, a switching transistor of a pixel circuit and a driver transistor in a driver circuit portion can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

<Structure with Liquid Crystal Element as Display Element>

Next, a structure including a liquid crystal element as a display element is described below with reference to FIG. 29B. In the description below, a reflective liquid crystal display device that performs display by reflecting external light is described; however, one embodiment of the present invention is not limited to this type of liquid crystal display device. For example, a light source (e.g., a back light or a side light) may be provided to form a transmissive liquid crystal display device or a transflective liquid crystal display device.

The display device 2501 illustrated in FIG. 29B has the same structure as the display device 2501 illustrated in FIG. 29A except the following points.

The pixel 2505 in the display device 2501 illustrated in FIG. 29B includes a liquid crystal element 2551 and the transistor 2502t that can supply electric power to the liquid crystal element 2551.

The liquid crystal element 2551 includes a lower electrode (also referred to as a pixel electrode), an upper electrode, and a liquid crystal layer 2529 between the lower electrode and the upper electrode. By the application of a voltage between the lower electrode and the upper electrode, the alignment state of the liquid crystal layer 2529 in the liquid crystal element 2551 can be changed. Furthermore, in the liquid crystal layer 2529, a spacer 2530a and a spacer 2530b are provided. Although not illustrated in FIG. 29B, an alignment film may be provided on each of the upper electrode and the lower electrode on the side in contact with the liquid crystal layer 2529.

As the liquid crystal layer 2529, thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions. In the case of employing a horizontal electric field mode liquid crystal display device, liquid crystal exhibiting a blue phase for which an alignment film is unnecessary may be used. In the case where a liquid crystal exhibiting a blue phase is used, an alignment film is not necessarily provided, so that rubbing treatment is also unnecessary. Accordingly, electrostatic discharge damage caused by the rubbing treatment can be prevented and defects and damage of the liquid crystal display device in the manufacturing process can be reduced.

The spacers 2530a and 2530b are formed by selectively etching an insulating film. The spacers 2530a and 2530b are provided in order to control the distance between the substrate 2510 and the substrate 2570 (the cell gap). Note that the spacers 2530a and 2530b may have different sizes from each other and are preferably have a columnar or spherical shape. Although the spacers 2530a and 2530b are provided on the substrate 2570 side in the non-limiting structure in FIG. 29B, they may be provided on the substrate 2510 side.

The upper electrode of the liquid crystal element 2551 is provided on the substrate 2570 side. An insulating layer 2531 is provided between the upper electrode and the coloring layer 2567 and the light-blocking layer 2568. The insulating layer 2531 has a function of covering the roughness caused by the coloring layer 2567 and the light-blocking layer 2568 to provide a flat surface. As the insulating layer 2531, an organic resin film may be used, for example. The lower electrode of the liquid crystal element 2551 has a function of a reflective electrode. The display device 2501 illustrated in FIG. 29B is of a reflective type which performs display by reflecting external light at the lower electrode and making the light pass through the coloring layer 2567. Note that in the case of forming a transmissive liquid crystal display device, a transparent electrode is provided as the lower electrode.

The display device 2501 illustrated in FIG. 29B includes an insulating layer 2522. The insulating layer 2522 covers the transistor 2502t and the like. The insulating layer 2522 has a function of covering the roughness caused by the pixel circuit to provide a flat surface and a function of forming roughness on the lower electrode of the liquid crystal element. In this way, roughness can be formed on the surface of the lower electrode. Therefore, when external light is incident on the lower electrode, the light is reflected diffusely at the surface of the lower electrode, whereby visibility can be improved. Note that in the case of forming a transmissive liquid crystal display device, a structure without such roughness may be employed.

<Touch Sensor>

Figure 30:
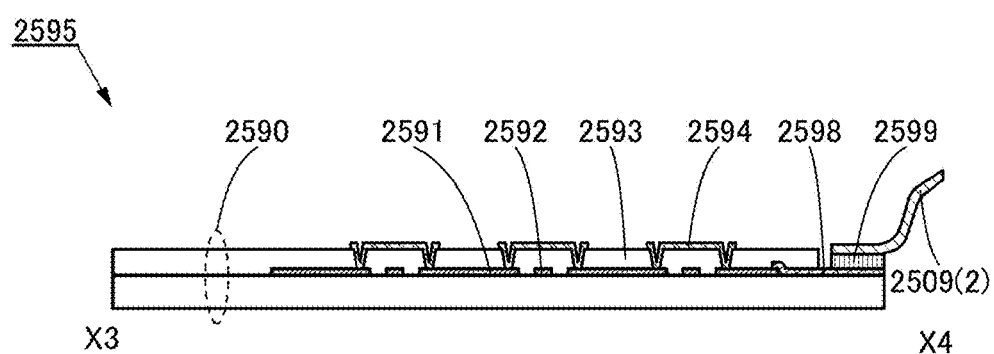
FIG. 30 is a cross-sectional view illustrating an example of a touch sensor.

Next, the touch sensor 2595 will be described in detail with reference to FIG. 30. FIG. 30 corresponds to a cross-sectional view taken along dashed-dotted line X3-X4 in FIG. 28B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Touch Panel>

Figure 31A:
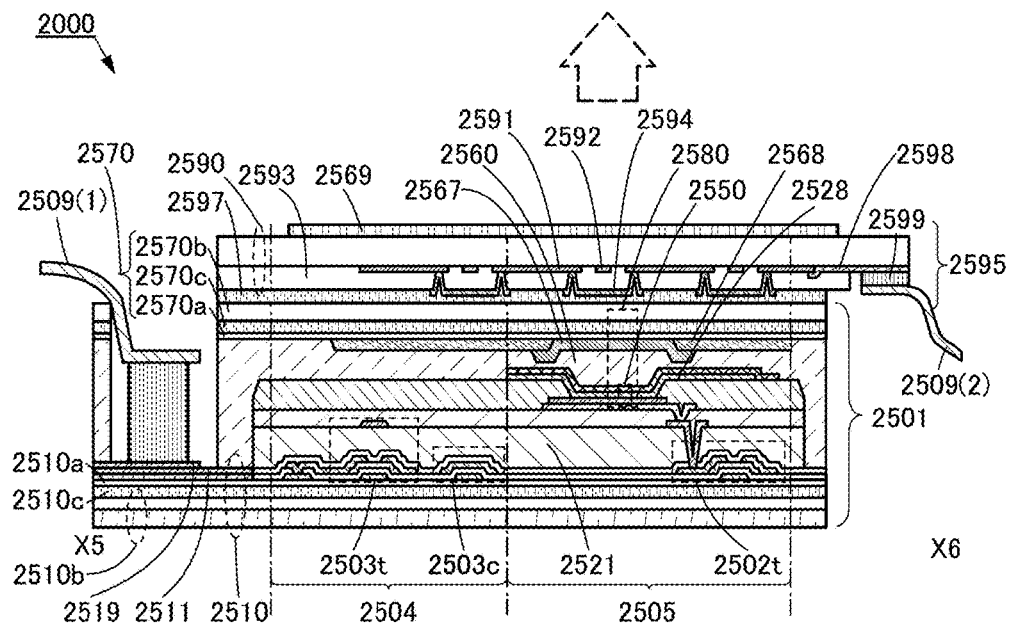
FIGS. 31A and 31B are cross-sectional views illustrating examples of a touch panel.

Next, the touch panel 2000 will be described in detail with reference to FIG. 31A. FIG. 31A corresponds to a cross-sectional view taken along dashed-dotted line X5-X6 in FIG. 28A.

In the touch panel 2000 illustrated in FIG. 31A, the display device 2501 described with reference to FIG. 29A and the touch sensor 2595 described with reference to FIG. 30 are attached to each other.

The touch panel 2000 illustrated in FIG. 31A includes an adhesive layer 2597 and an anti-reflective layer 2569 in addition to the components described with reference to FIG. 29A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 31A will be described with reference to FIG. 31B.

Figure 31B:
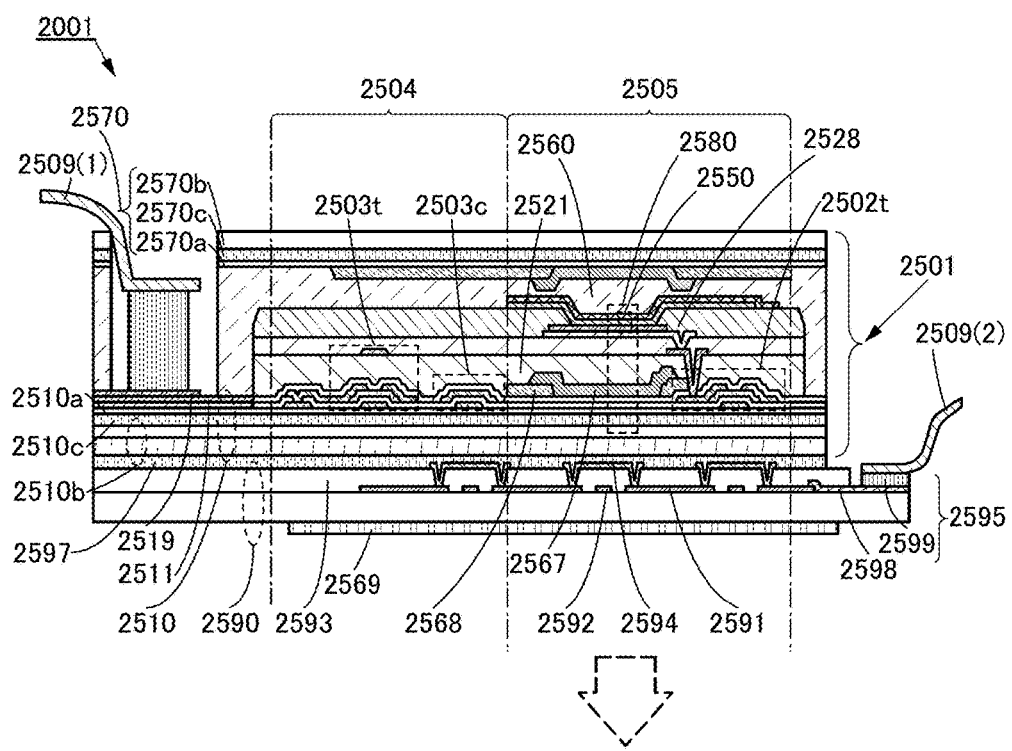

FIG. 31B is a cross-sectional view of a touch panel 2001. The touch panel 2001 illustrated in FIG. 31B differs from the touch panel 2000 illustrated in FIG. 31A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 31B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 31B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 31A or FIG. 31B, light may be emitted from the light-emitting element to one or both of upper and lower sides of the substrate.

<Driving Method of Touch Panel>

Next, an example of a method for driving a touch panel will be described with reference to FIGS. 32A and 32B.

Figure 32A:
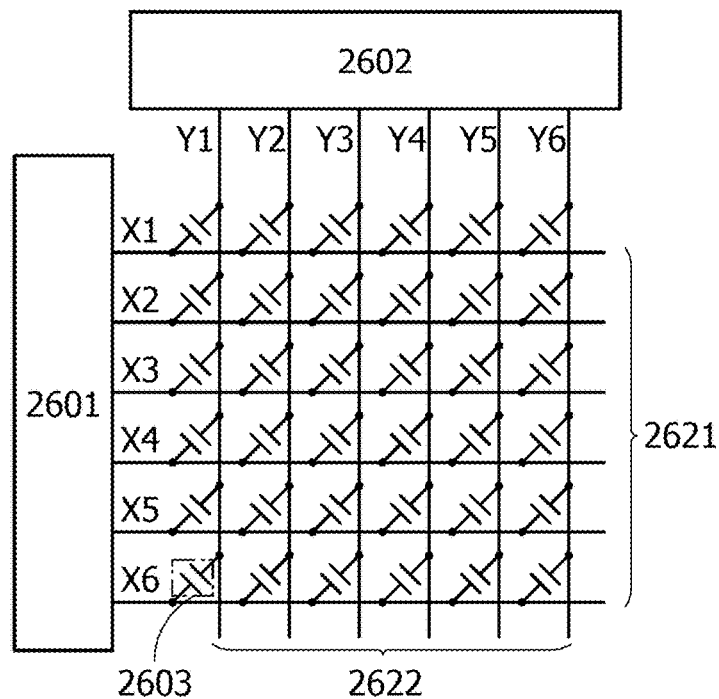
FIGS. 32A and 32B are a block diagram and a timing chart of a touch sensor.

FIG. 32A is a block diagram illustrating the structure of a mutual capacitive touch sensor. FIG. 32A illustrates a pulse voltage output circuit 2601 and a current sensing circuit 2602. Note that in FIG. 32A, six wirings X1 to X6 represent the electrodes 2621 to which a pulse voltage is applied, and six wirings Y1 to Y6 represent the electrodes 2622 that detect changes in current. FIG. 32A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 32B:
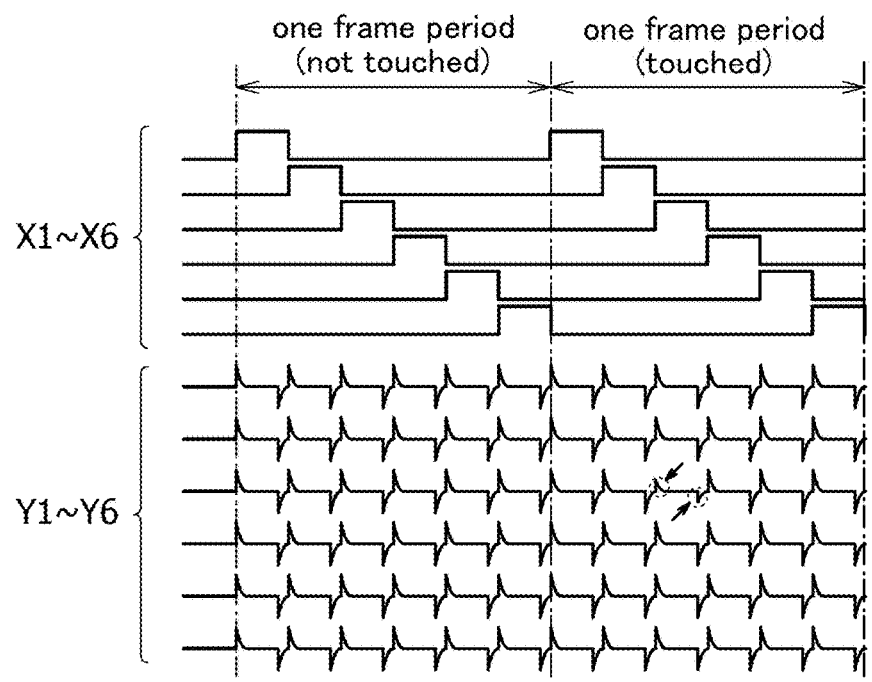

FIG. 32B is a timing chart showing input and output waveforms in the mutual capacitive touch sensor illustrated in FIG. 32A. In FIG. 32B, sensing of a sensing target is performed in all the rows and columns in one frame period. FIG. 32B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Sensor Circuit>

Figure 33:
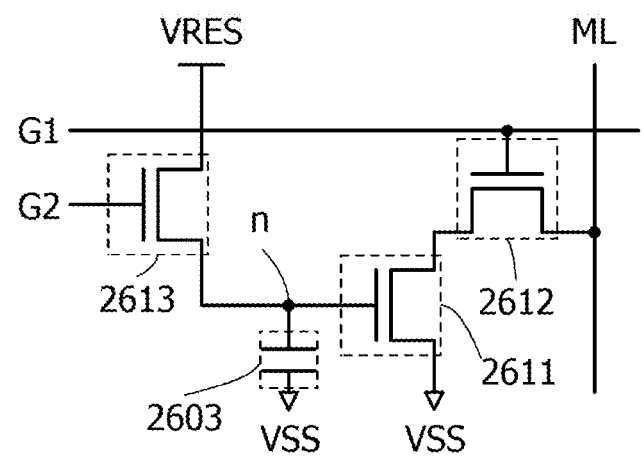
FIG. 33 is a circuit diagram of a touch sensor.

Although FIG. 32A illustrates a passive type touch sensor in which only the capacitor 2603 is provided at the intersection of wirings as a touch sensor, an active type touch sensor including a transistor and a capacitor may be used. FIG. 33 illustrates an example of a sensor circuit included in an active type touch sensor.

The sensor circuit in FIG. 33 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 33 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, any of the transistors described in the above embodiments can be used. In particular, it is preferable to use any of the transistors described in the above embodiments as the transistor 2613 because the potential of the node n can be held for a long time and the frequency of operation of resupplying VRES to the node n (refresh operation) can be reduced.

The structures described in this embodiment can be used in appropriate combination with any of the structures described in the other embodiments.

Embodiment 5

In this embodiment, a display module and electronic devices that include a semiconductor device of one embodiment of the present invention are described with reference to FIG. 34 and FIGS. 35A to 35G.

<Display Module>

Figure 34:
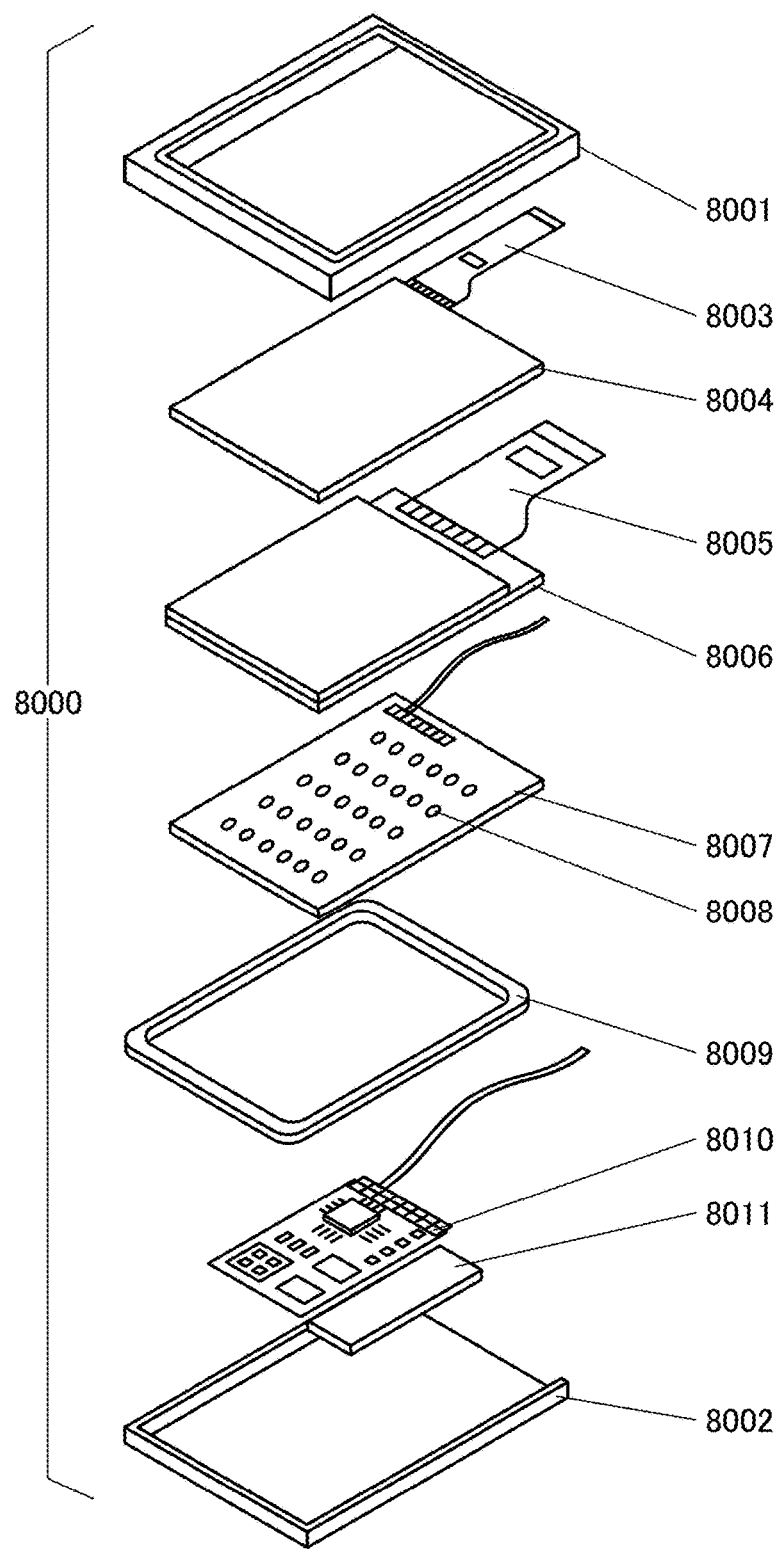
FIG. 34 illustrates a display module.

In a display module 8000 illustrated in FIG. 34, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap the display panel 8006. A counter substrate (sealing substrate) of the display panel 8006 can have a touch panel function. A photosensor may be provided in each pixel of the display panel 8006 to form an optical touch panel.

The backlight 8007 includes light sources 8008. Note that although a structure in which the light sources 8008 are provided over the backlight 8007 is illustrated in FIG. 34, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<Electronic Device>

FIGS. 35A to 35G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 35A to 35G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 35A to 35G are not limited thereto, and the electronic devices can have a variety of functions. Although not illustrated in FIGS. 35A to 35G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like. Although not illustrated in FIGS. 35A to 35G, the electronic devices may be provided with an antenna or the like to have a wireless communication function.

The electronic devices illustrated in FIGS. 35A to 35G will be described in detail below.

Figure 35A:
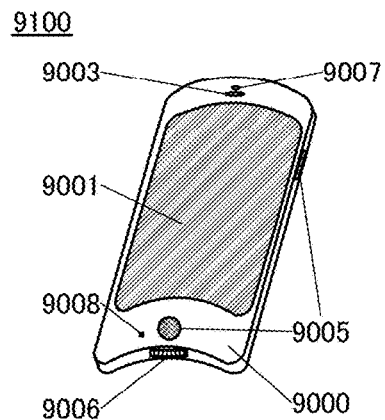
FIGS. 35A to 35G illustrate electronic devices.

FIG. 35A is a perspective view of a portable information terminal 9100. The display portion 9001 of the portable information terminal 9100 is flexible and thus can be incorporated along the curved surface of the housing 9000.

Furthermore, the display portion 9001 includes a touch sensor, and operation can be performed by touching a screen with a finger, a stylus, or the like. For example, by touching an icon displayed on the display portion 9001, an application can be started.

Figure 35D:
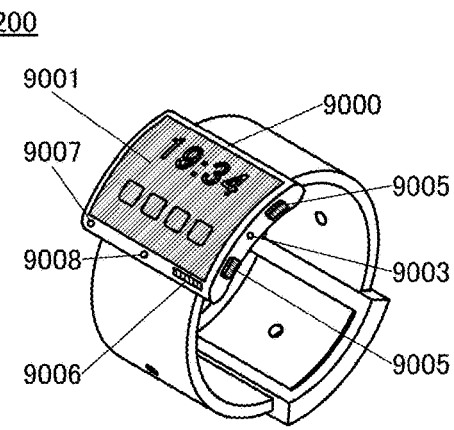
Figure 35B:
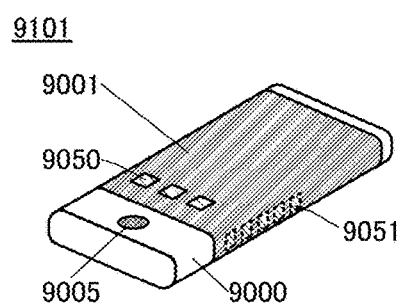

FIG. 35B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 35B, can be positioned in the portable information terminal 9101 as in the portable information terminal 9100 illustrated in FIG. 35A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the strength of a received signal. Instead of the information 9051, the operation buttons 9050 or the like may be displayed in the position where the information 9051 is displayed.

Figure 35E:
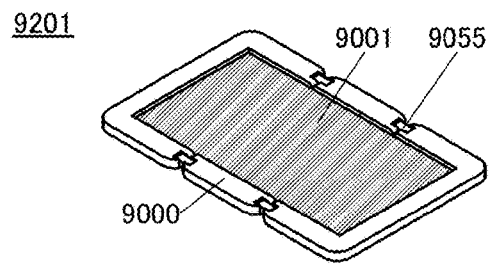
Figure 35C:
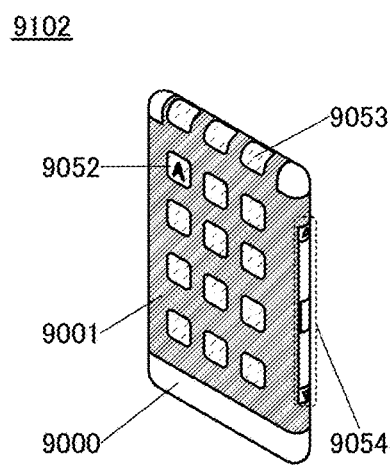

FIG. 35C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

FIG. 35D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 35F:
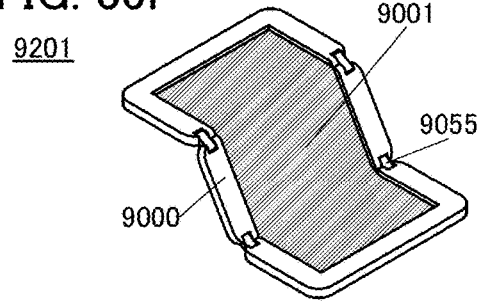
Figure 35G:
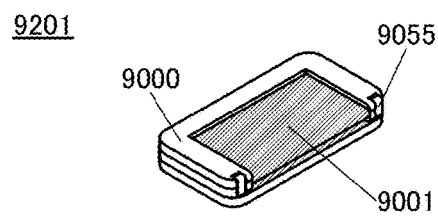

FIGS. 35E, 35F, and 35G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment each include the display portion for displaying some kinds of information. However, a semiconductor device according to one embodiment of the present invention can also be used for an electronic device that does not include a display portion. Furthermore, the display portions of the electronic devices described in this embodiment may also be non-flexible and can display images on a flat surface without limitation to a flexible mode capable of displaying images on a curved display surface or a foldable mode.

The structures described in this embodiment can be used in appropriate combination with any of the structures described in the other embodiments.

This application is based on Japanese Patent Application serial no. 2014-218938 filed with Japan Patent Office on Oct. 28, 2014, the entire contents of which are hereby incorporated by reference.

What is claimed is:

1. A manufacturing method of a semiconductor device comprising the steps of:
    forming a gate electrode;
    forming a first insulating film over the gate electrode;
    forming an oxide semiconductor film over the first insulating film;
    forming a second insulating film over the oxide semiconductor film;
    forming a first metal oxide film over the second insulating film;
    adding oxygen to the second insulating film through the first metal oxide film; and
    forming a second metal oxide film over the first metal oxide film,
    wherein the oxide semiconductor film includes indium,
    wherein the second insulating film includes silicon,
    wherein the first metal oxide film is a conductive film containing indium,
    wherein the second metal oxide film is an insulating film containing aluminum, and
    wherein the second metal oxide film includes a region where the second metal oxide film and the first metal oxide film are mixed.

2. The manufacturing method of a semiconductor device according to claim 1,
    wherein the second metal oxide film is formed by a sputtering method, and
    wherein the region is formed in the step of forming the second metal oxide film.

3. The manufacturing method of a semiconductor device according to claim 1 further comprising steps of:
    forming a source electrode electrically connected to the oxide semiconductor film; and
    forming a drain electrode electrically connected to the oxide semiconductor film.

4. The manufacturing method of a semiconductor device according to claim 3, wherein each of the source electrode and the drain electrode is over the second metal oxide film.

5. The manufacturing method of a semiconductor device according to claim 1 further comprising a step of forming a conductive film over the second metal oxide film.

6. The manufacturing method of a semiconductor device according to claim 1,
wherein the oxide semiconductor film comprises In, Zn, and M and
wherein M is Ti, Ga, Y, Zr, La, Ce, Nd, Sn, or Hf.

7. The manufacturing method of a semiconductor device according to claim 1,
wherein the oxide semiconductor film includes a crystal part, and
wherein the crystal part has c-axis alignment.

8. The manufacturing method of a semiconductor device according to claim 1, wherein oxygen molecules of more than or equal to $8.0\times10^{14}/cm^2$ are detected from the second insulating film by thermal desorption spectroscopy after the step of adding the oxygen to the second insulating film.

9. A manufacturing method of a semiconductor device comprising the steps of:
forming a gate electrode;
forming a first insulating film over the gate electrode;
forming an oxide semiconductor film over the first insulating film;
forming a second insulating film over the oxide semiconductor film;
forming a first metal oxide film over the second insulating film;
adding oxygen to the second insulating film through the first metal oxide film;
forming a second metal oxide film over the first metal oxide film; and
heating the first metal oxide film and the second metal oxide film,
wherein the oxide semiconductor film includes indium,
wherein the second insulating film includes silicon,
wherein the first metal oxide film is a conductive film containing indium,
wherein the second metal oxide film is an insulating film containing aluminum,
wherein the second metal oxide film includes a region where the second metal oxide film and the first metal oxide film are mixed, and
wherein the region is formed in the step of heating the first metal oxide film and the second metal oxide film.

10. The manufacturing method of a semiconductor device according to claim 9 further comprising steps of:
forming a source electrode electrically connected to the oxide semiconductor film; and
forming a drain electrode electrically connected to the oxide semiconductor film.

11. The manufacturing method of a semiconductor device according to claim 10, wherein each of the source electrode and the drain electrode is over the second metal oxide film.

12. The manufacturing method of a semiconductor device according to claim 9 further comprising a step of forming a conductive film over the second metal oxide film.

13. The manufacturing method of a semiconductor device according to claim 9,
wherein the oxide semiconductor film comprises In, Zn, and M and
wherein M is Ti, Ga, Y, Zr, La, Ce, Nd, Sn, or Hf.

14. The manufacturing method of a semiconductor device according to claim 9,
wherein the oxide semiconductor film includes a crystal part, and
wherein the crystal part has c-axis alignment.

15. The manufacturing method of a semiconductor device according to claim 9, wherein oxygen molecules of more than or equal to $8.0\times10^{14}/cm^2$ are detected from the second insulating film by thermal desorption spectroscopy after the step of adding the oxygen to the second insulating film.

* * * * *